(12) United States Patent
Atsatt et al.

(10) Patent No.: US 10,181,001 B2
(45) Date of Patent: Jan. 15, 2019

(54) METHODS AND APPARATUS FOR AUTOMATICALLY IMPLEMENTING A COMPENSATING RESET FOR RETIMED CIRCUITRY

(71) Applicant: Intel Corporation, Santa Clara, CA (US)

(72) Inventors: Sean R. Atsatt, Santa Cruz, CA (US); Mahesh A. Iyer, Fremont, CA (US)

(73) Assignee: Intel Corporation, Santa Clara, CA (US)

( * ) Notice: Subject to any disclaimer, the term of this patent is extended or adjusted under 35 U.S.C. 154(b) by 51 days.

(21) Appl. No.: 15/422,971

(22) Filed: Feb. 2, 2017

(65) Prior Publication Data

US 2018/0218104 A1    Aug. 2, 2018

(51) Int. Cl.
*G06F 17/50*    (2006.01)
*G06F 13/42*    (2006.01)

(52) U.S. Cl.
CPC .......... *G06F 17/5054* (2013.01); *G06F 13/42* (2013.01); *G06F 17/5072* (2013.01)

(58) Field of Classification Search
CPC ............... G06F 17/505; G06F 17/5031; G06F 17/5045; G06F 17/5054
USPC ................................................. 716/116–117
See application file for complete search history.

(56) References Cited

U.S. PATENT DOCUMENTS

| | | | |
|---|---|---|---|
| 7,120,883 B1 | 10/2006 | van Antwerpen et al. | |
| 7,689,955 B1 | 3/2010 | van Antwerpen et al. | |
| 8,402,408 B1 | 3/2013 | van Antwerpen et al. | |
| 8,863,067 B1 | 10/2014 | Caldwell et al. | |
| 9,053,274 B1 | 6/2015 | van Antwerpen et al. | |
| 9,292,638 B1 | 3/2016 | Chiu | |
| 9,356,769 B2 | 5/2016 | Lin | |
| 2011/0206176 A1* | 8/2011 | Hutchings | G06M 3/00 377/26 |

OTHER PUBLICATIONS

Iyer et al., "Identifying Sequential Redundancies Without Search", DAC '96 Proceedings of the 33rd annual Design Automation Conference, Jun. 1, 1996, pp. 457-462, ACM New York, NY.

(Continued)

*Primary Examiner* — Paul Dinh
(74) *Attorney, Agent, or Firm* — Treyz Law Group, P.C.; Tianyi He; Jason Tsai

(57) ABSTRACT

A compensating initialization module may be automatically inserted into a design to compensate for register retiming which changes the designs behavior under reset. The device configuration circuitry may provide an adjustment sequence length as well as a start signal to the initialization module to properly reset the retimed user logic implemented on the integrated circuit after initial configuration and unfreezing of the integrated circuit. The auto initialization module may control the c-cycle initialization process and indicate to the user logic when c-cycle initialization has completed. The user logic may subsequently begin a user-specified reset sequence. When the user-specified reset sequence ends, the user logic implemented on the integrated circuit may begin normal operations. Additionally, a user reset request may also trigger the auto initialization module to begin a reset process.

20 Claims, 14 Drawing Sheets

(56) References Cited

OTHER PUBLICATIONS

Iyer et al., Surprises in Sequential Redundancy Identification, EDTC '96 Proceedings of the 1996 European conference on Design and Test, 1996, p. 88, IEEE Computer Society Washington, DC.
Singhal et al., "The Validity of Retiming Sequential Circuits", DAC '95 Proceedings of the 32nd annual ACM/IEEE Design Automation Conference, 1995, pp. 316-321, ACM New York, NY.
M.A. Iyer, "On Ensuring the Validity of Retiming Sequential Circuits with Applications to FPGA High Performance Design and Verification", Altera/Intel PSG internal document, Apr. 2016.
V. Singhal, "Design Replacements for Sequential Circuits", Ph. D. Thesis, Department of Computer Science, University of California, Berkeley, Mar. 1996.
M.A. Iyer, "On Redundancy and Untestability in Sequential Circuits", Ph.D. Thesis, Department of Electrical Engineering, Illinois Institute of Technology, Chicago, Jul. 1995.
Iyer et al., U.S. Appl. No. 15/342,286 filed, Nov. 3, 2016.
Iyer at el., U.S. Appl. No. 15/140,327 filed, Apr. 27, 2016.
Iyer et al., U.S. Appl. No. 15/352,487, filed Nov. 15, 2016.
Iyer et al., U.S. Appl. No. 15/354,809, filed Nov. 17, 2016.

\* cited by examiner

METHODS AND APPARATUS FOR AUTOMATICALLY IMPLEMENTING A COMPENSATING RESET FOR RETIMED CIRCUITRY

BACKGROUND

This relates to integrated circuits and, more particularly, to implementing a delayed reset for registers within an integrated circuit design.

Every transition from one technology node to the next has resulted in smaller transistor geometries and thus potentially more functionality implemented per unit area on an integrated circuit die. Synchronous integrated circuits have further benefited from this development as evidenced by reduced interconnect and cell delays, which have led to performance increases.

To further increase the performance, solutions such as register retiming have been proposed, where registers are moved among portions of combinational logic, thereby achieving a more balanced distribution of delays between registers, and thus the integrated circuit may be operated at a potentially higher clock frequency.

The registers are typically implemented using clock-edge-triggered flip-flops. Prior to retiming, when the integrated circuit is powered up, these digital flip-flops are also powered to an initial state, but this initial state may be unknown. Therefore, a reset sequence is typically provided to the flip-flops to reset the flip-flops and bring them to a known reset state.

However, after retiming, the retimed integrated circuit may behave differently from the integrated circuit prior to retiming. In some cases, the same reset sequence provided to the flip-flops prior to retiming will not work with the retimed flip-flops. Therefore, it would be desirable to account for flip-flops moved during retiming, to provide an updated reset sequence for the retimed flip-flops, and to implement circuitry that resets the retimed flip-flops using the updated reset sequence.

It is within this context that the embodiments herein arise.

SUMMARY

This relates generally to integrated circuits and, more particularly, to methods and apparatus for automatically resetting retimed circuitry using a delayed reset sequence generated by computer-aided design (CAD) tools. CAD tools implemented on integrated circuit design computing equipment are often used to perform register move operations (e.g., register retiming, register duplication, register merging) to improve the overall circuit performance of the circuit design.

To accurately reset retimed circuitry using a delayed reset sequence, an integrated circuit may include logic circuitry, configuration circuitry, and an initialization module. The logic circuitry may be reset using an original reset sequence on a per-clock domain basis. The logic circuitry may provide a clock signal for a given clock domain to the initialization module. The initialization module may receive a reset trigger signal from either the configuration circuitry or logic circuitry (e.g., a start signal from the configuration circuitry or a reset request signal from the logic circuitry) that may be synchronized to the clock signal using a synchronization circuit within the initialization module. The synchronization circuit may generate a corresponding synchronized reset trigger signal.

The initialization module may include a counter circuit that receives the synchronized reset trigger signal. The configuration circuitry, which programs the logic circuitry to implement a custom logic function, may also provide a count value corresponding to the original reset sequence to the counter circuit. The initialization module may be interposed between the logic circuitry and the configuration circuitry to automatically delay the original reset sequence a count value number of clock cycles. As such, the counter circuit in the initialization module may provide a count signal to a reset control circuit in the initialization module.

When the counter circuit has counted c clock-cycles, the reset control circuit may assert an output signal (e.g., a reset control signal) that is convey to the logic circuitry. In response to a deasserted reset trigger signal, the reset control circuit may deasserted the output signal. This constitutes a handshaking operation between the reset control signal and the reset trigger signal.

The logic circuitry may include a reset state machine that receives the reset control signal (or simply control signal) from the reset control circuit. The reset state machine may output a request signal in response to a received error signal that indicates an error during the operation of user logic circuits. The reset state machine may also output a reset signal to the user logic circuits, more specifically, registers within the user logic circuits, to implement a reset sequence (e.g., an adjustment sequence, an original sequence, etc.).

Further features of the invention, its nature and various advantages will be more apparent from the accompanying drawings and following detailed description.

DETAILED DESCRIPTION

The presented embodiments relate to integrated circuits and, more particularly, circuitry within the integrated circuits that is used to implement a delayed reset sequence (e.g., a user-specified reset sequence delayed by c clock cycles).

Performing retiming operations on an integrated circuit may change the configuration of registers within the integrated circuit. In some cases, the retimed registers will not accurately reset using the reset sequence for registers prior to retiming (e.g., a reset sequence provided by a designer for a corresponding circuit design).

It would therefore be desirable to provide an improved way of modeling registers moved during retiming to calculate an adjustment value and generate a retimed reset sequence using the calculated adjustment value and the reset sequence used prior to retiming. In accordance with an embodiment, this can be accomplished by tracking the movement of retimed registers across different types of circuit elements. Operated in this way, a minimum length of a prepended adjustment sequence used in the retimed reset sequence may be calculated.

Reset initialization circuitry within the integrated circuit may provide the prepended adjustment sequence to the retimed registers. Subsequent to providing the prepended adjustment sequence, the retimed registers may receive the designer-provided reset sequence. The reset initialization circuitry may properly reset the retimed circuitry after initial configuration of the integrated circuit and during user requested reset of integrated circuit.

It will be recognized by one skilled in the art, that the present exemplary embodiments may be practiced without some or all of these specific details. In other instances, well-known operations have not been described in detail in order not to unnecessarily obscure the present embodiments.

Figure 1:
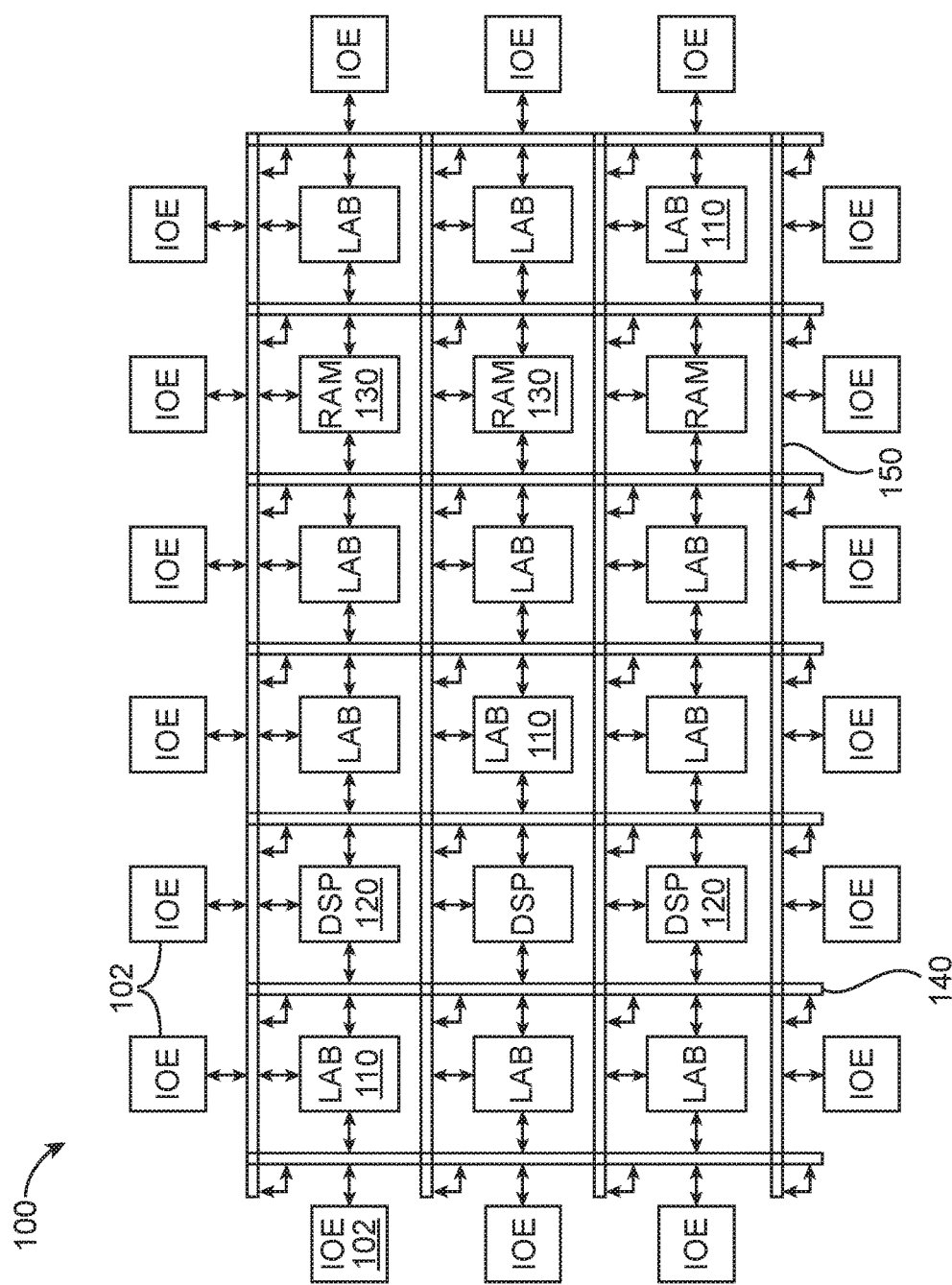
FIG. 1 is a diagram of an illustrative programmable integrated circuit in accordance with an embodiment.

An illustrative embodiment of a programmable integrated circuit such as programmable logic device (PLD) 100 that may be configured to implement a circuit design is shown in FIG. 1. As shown in FIG. 1, the programmable logic device (PLD) may include a two-dimensional array of functional blocks, including logic array blocks (LABs) 110 and other functional blocks, such as random access memory (RAM) blocks 130 and digital signal processing (DSP) blocks 120, for example. Functional blocks such as LABs 110 may include smaller programmable regions (e.g., logic elements, configurable logic blocks, or adaptive logic modules) that receive input signals and perform custom functions on the input signals to produce output signals.

Programmable logic device 100 may contain programmable memory elements. Memory elements may be loaded with configuration data (also called programming data) using input-output elements (IOEs) 102. Once loaded, the memory elements each provide a corresponding static control signal that controls the operation of an associated functional block (e.g., LABs 110, DSP 120, RAM 130, or input-output elements 102).

In a typical scenario, the outputs of the loaded memory elements are applied to the gates of metal-oxide-semiconductor transistors in a functional block to turn certain transistors on or off and thereby configure the logic in the functional block including the routing paths. Programmable logic circuit elements that may be controlled in this way include parts of multiplexers (e.g., multiplexers used for forming routing paths in interconnect circuits), look-up tables, logic arrays, AND, OR, NAND, and NOR logic gates, pass gates, etc.

The memory elements may use any suitable volatile and/or non-volatile memory structures such as random-access-memory (RAM) cells, fuses, antifuses, programmable read-only-memory memory cells, mask-programmed and laser-programmed structures, combinations of these structures, etc. Because the memory elements are loaded with configuration data during programming, the memory elements are sometimes referred to as configuration memory, configuration RAM (CRAM), or programmable memory elements.

In addition, the programmable logic device may have input-output elements (IOEs) 102 for driving signals off of PLD 100 and for receiving signals from other devices. Input-output elements 102 may include parallel input-output circuitry, serial data transceiver circuitry, differential receiver and transmitter circuitry, or other circuitry used to connect one integrated circuit to another integrated circuit.

The PLD may also include programmable interconnect circuitry in the form of vertical routing channels 140 (i.e., interconnects formed along a vertical axis of PLD 100) and horizontal routing channels 150 (i.e., interconnects formed along a horizontal axis of PLD 100), each routing channel including at least one track to route at least one wire. If desired, the interconnect circuitry may include pipeline elements, and the contents stored in these pipeline elements may be accessed during operation. For example, a programming circuit may provide read and write access to a pipeline element.

Note that other routing topologies, besides the topology of the interconnect circuitry depicted in FIG. 1, are intended to be included within the scope of the present invention. For example, the routing topology may include wires that travel diagonally or that travel horizontally and vertically along different parts of their extent as well as wires that are perpendicular to the device plane in the case of three dimensional integrated circuits, and the driver of a wire may be located at a different point than one end of a wire. The routing topology may include global wires that span substantially all of PLD 100, fractional global wires such as wires that span part of PLD 100, staggered wires of a particular length, smaller local wires, or any other suitable interconnection resource arrangement.

If desired, programmable logic device (PLD) 100 may be configured to implement a custom circuit design. For example, the configuration RAM may be programmed such that LABs 110, DSP 120, and RAM 130, programmable interconnect circuitry (i.e., vertical channels 140 and horizontal channels 150), and the input-output elements 102 form the circuit design implementation.

Figure 2:
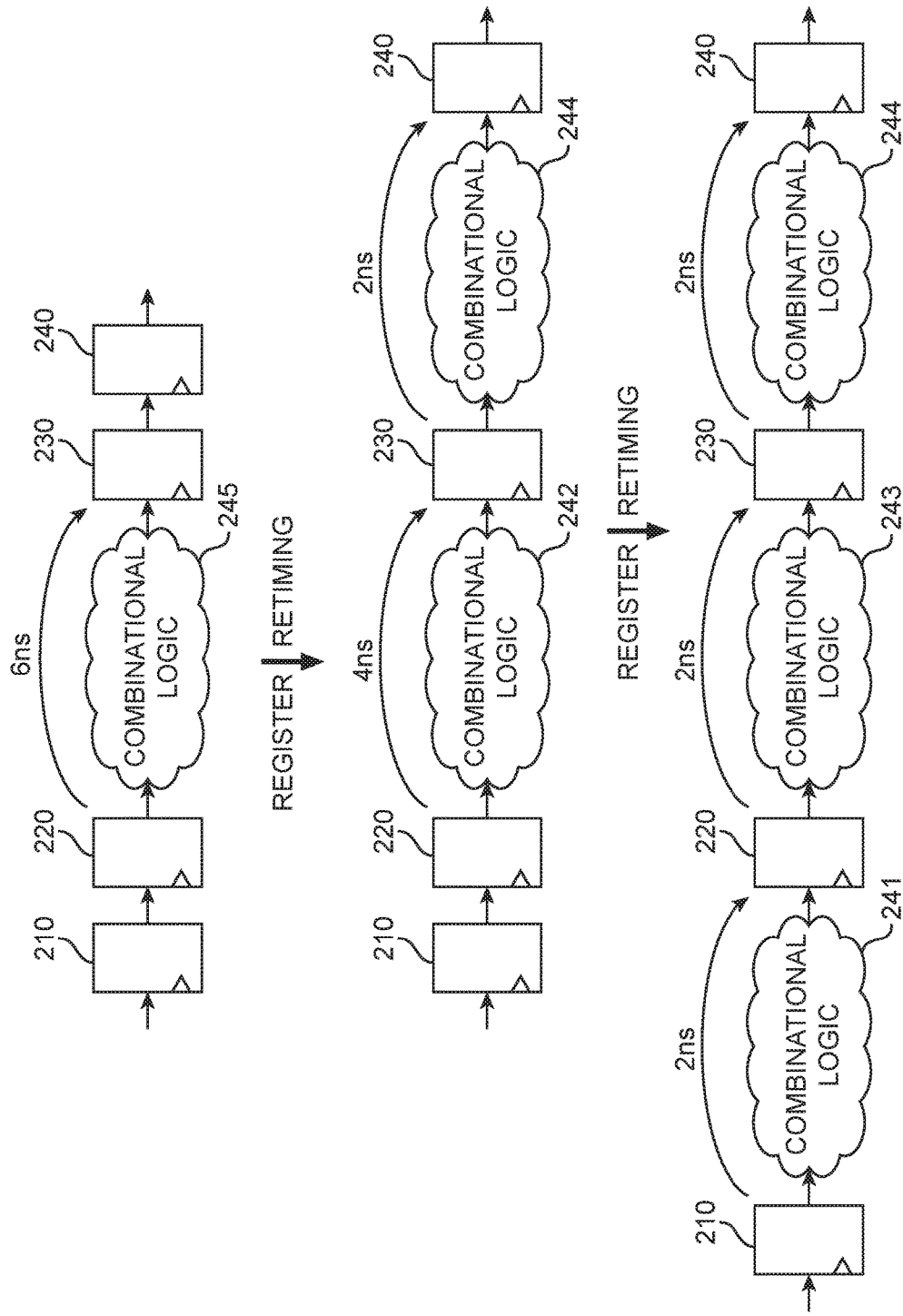
FIG. 2 is a diagram of illustrative retiming operations in accordance with an embodiment.

FIG. 2 shows an example of different versions of a circuit design that PLD 100 may implement. The first version of the circuit design may include registers 210, 220, 230, 240, and combinational logic 245. Register 210 may send a signal to register 220; register 220 may send the signal through combinational logic 245 to register 230; and register 230 may send the signal to register 240. As an example, the delay on the path from register 220 through combinational logic 245 to register 230 may have a delay of 6 nanoseconds (ns), whereas the delay between register 210 and 220 and between registers 230 and 240 may have minimal delay (e.g., a delay of 0.5 ns, a delay very close to 0 ns, etc.). Thus, the first version of the circuit design may operate at a frequency of 166 MHz.

Performing register retiming on the first version of the circuit design may create a second version of the circuit design. For example, register 230 may be pushed back through a portion of combinational logic 245 (sometimes referred to as backward retiming), thereby separating combinational logic 245 of the first version of the circuit design into combinational logic 242 and 244 of the second version of the circuit design. In the second version of the circuit design, register 210 may send a signal to register 220; register 220 may send the signal through combinational logic 242 to register 230; and register 230 may send the signal through combinational logic 244 to register 240.

As an example, the delay on the path from register 220 through combinational logic 242 to register 230 may have a delay of 4 ns, and the delay from register 230 through combinational logic 244 to register 240 may have a delay of 2 ns. Thus, the second version of the circuit design may operate at a frequency of 250 MHz, which is limited by the path with the longest delay (sometimes referred to as the critical path).

Performing register retiming on the second version of the circuit design may create a third version of the circuit design. For example, register 220 may be pushed forward through a portion of combinational logic 242 (sometimes referred to as "forward" retiming), thereby separating combinational logic 242 of the second version of the circuit design into combinational logic 241 and 243 of the third version of the circuit design. In the third version of the circuit design, register 210 may send a signal through combinational logic 241 to register 220; register 220 may send the signal through combinational logic 243 to register 230; and register 230 may send the signal through combinational logic 244 to register 240.

As an example, the delay on the paths from register 210 through combinational logic 241 to register 220, from register 220 through combinational logic 243 to register 230, and from register 230 through combinational logic 244 to register 240 may all have a delay of 2 ns. Thus, the third version of the circuit design may operate at a frequency of 500 MHz, which is thrice the frequency at which the first version of the circuit design may operate.

Figure 3:
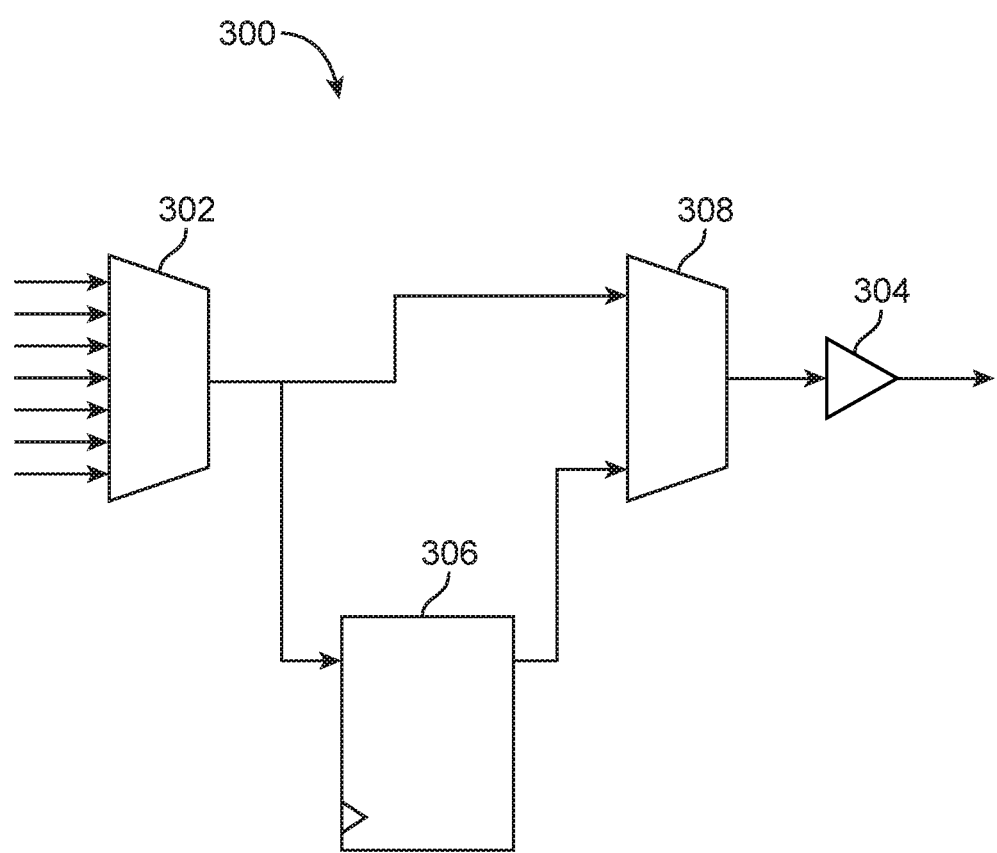
FIG. 3 is a diagram of an illustrative pipelined routing resource which uses a register to pipeline a routing signal in accordance with an embodiment.

If desired, routing resources such as the vertical routing channels 140 or the horizontal routing channels 150 of FIG. 1 may include pipeline elements, which can facilitate register retiming. FIG. 3 depicts a pipelined routing resource 300 which uses a register in accordance with an embodiment. As shown, the pipelined routing resource 300 includes a first multiplexer 302, a driver 304, a register 306, and a second multiplexer 308.

Multiplexer 302 may be a driver input multiplexer (DIM) or a functional block input multiplexer (FBIM). A DIM may select a signal from multiple sources and send the selected signal to driver 304 that drives a corresponding wire. The multiple sources may include signals from outputs of functional blocks and other routing wires that travel in the same or in an orthogonal direction to the wire. A FBIM outputs a signal to a functional block and may select the signal from multiple routing wires.

As shown in FIG. 3, multiplexer 302 may be pipelined by providing its output to the data input of register 306. Multiplexer 308 in pipelined routing resource 300 may receive the output of multiplexer 302 directly and may also receive the data output from register 306.

Although pipelined routing resource 300 includes register 306, it will be recognized by one skilled in the art that different register implementations may be used to store a routing signal such as an edge-triggered flip-flop, a pulse latch, a transparent-low latch, a transparent-high latch, just to name a few. Thus, in order not to unnecessarily obscure the present embodiments, we refer to the storage circuit in the pipelined routing resource as a pipeline storage element.

Multiplexer 308 may enable the pipelined routing resource 300 to be either used in a non-pipeline mode or in a pipeline register mode. In the non-pipeline mode, the output of multiplexer 308 selects the direct output of multiplexer 302. In the pipeline mode, multiplexer 308 may select the output of register 306. Multiplexer 308 may provide its output to driver circuit 304, and the output of driver circuit 304 may be used to drive a routing wire. The routing wire may span multiple functional blocks (e.g., for a pipelined routing resource with a DIM). Alternatively, the routing wire may be inside a functional block (e.g., for a pipelined routing resource with a FBIM).

Every DIM/FBIM may include a register such as register 306 such that all the routing multiplexers are pipelined. However, in some embodiments, that may be unnecessary as the capabilities provided may exceed design requirements. Thus, in certain embodiments only a fraction, such as one-half or one-fourth, of the routing multiplexers may be pipelined. For example, a signal may take 150 picoseconds (ps) to traverse a wire of a given length, but a clock signal may be constrained to operate with a 650 ps clock cycle. Thus, providing a pipeline register such as register 306 every fourth wire may be sufficient in this example. Alternatively, the registers may be placed more frequently than every fourth wire (e.g., every second wire) to provide a higher degree of freedom in selection of which registers are used.

Pipelined routing resources such as pipelined routing resource 300 may facilitate register retiming operations, such as the register retiming illustrated in FIG. 2. For example, consider the scenario in which register 230 is implemented by a first instance of a pipelined routing element that is operated in pipeline register mode (i.e., register 230 is implemented by register 306 of a first instance of a pipelined routing resource 300). Consider further that the path from register 220 through combinational logic 245 to register 230 includes a second instance of a pipelined routing element that is operated in non-pipeline mode. Thus, switching the first instance of the pipelined routing element from operating in pipeline register mode to operating in non-pipeline mode and switching the second instance of the pipelined routing element from operating in non-pipeline mode to operating in pipeline register mode may transform the first version into the second version of the circuit design presented in FIG. 2.

Computer-aided design (CAD) tools in a circuit design system may evaluate whether register retiming may improve the performance of a current version of a circuit design or whether the current version of the circuit design meets a given performance criterion. If desired, and in the event that the CAD tools determine that register retiming would improve the performance of the current version of the circuit design or that the current version of the circuit design misses the given performance criterion, the CAD tools may execute register retiming operations that transform the current version of the circuit design into another version of the circuit design (e.g., as illustrated in FIG. 2).

Figure 4:
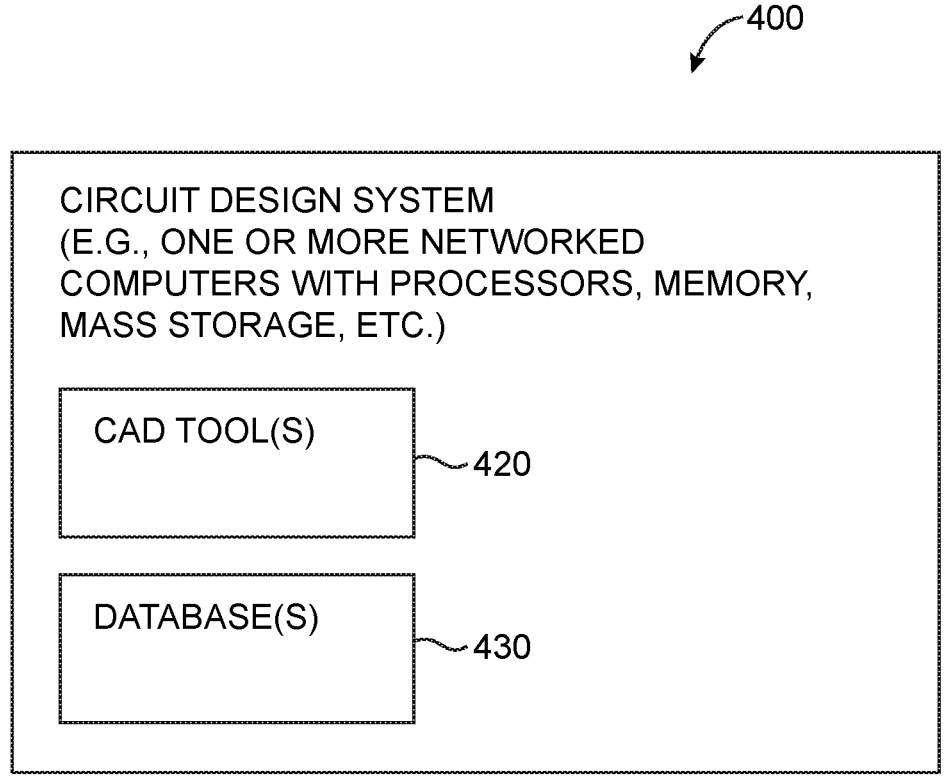
FIG. 4 is a diagram of a circuit design system that may be used to design integrated circuits in accordance with an embodiment.

An illustrative circuit design system 400 in accordance with an embodiment is shown in FIG. 4. Circuit design system 400 may be implemented on integrated circuit design computing equipment. For example, system 400 may be based on one or more processors such as personal computers, workstations, etc. The processor(s) may be linked using a network (e.g., a local or wide area network). Memory in these computers or external memory and storage devices such as internal and/or external hard disks may be used to store instructions and data.

Software-based components such as computer-aided design tools 420 and databases 430 reside on system 400. During operation, executable software such as the software of computer aided design tools 420 runs on the processor(s) of system 400. Databases 430 are used to store data for the operation of system 400. In general, software and data may be stored on any computer-readable medium (storage) in system 400. Such storage may include computer memory chips, removable and fixed media such as hard disk drives, flash memory, compact discs (CDs), digital versatile discs (DVDs), Blu-ray discs (BDs), other optical media, and floppy diskettes, tapes, or any other suitable memory or storage device(s). When the software of system 400 is installed, the storage of system 400 has instructions and data that cause the computing equipment in system 400 to execute various methods (processes). When performing these processes, the computing equipment is configured to implement the functions of the circuit design system.

The computer aided design (CAD) tools 420, some or all of which are sometimes referred to collectively as a CAD tool, a circuit design tool, or an electronic design automation (EDA) tool, may be provided by a single vendor or by multiple vendors. Tools 420 may be provided as one or more suites of tools (e.g., a compiler suite for performing tasks associated with implementing a circuit design in a programmable logic device) and/or as one or more separate software components (tools). Database(s) 430 may include one or more databases that are accessed only by a particular tool or tools and may include one or more shared databases. Shared databases may be accessed by multiple tools. For example, a first tool may store data for a second tool in a shared database. The second tool may access the shared database to retrieve the data stored by the first tool. This allows one tool to pass information to another tool. Tools may also pass information between each other without storing information in a shared database if desired.

Figure 5:
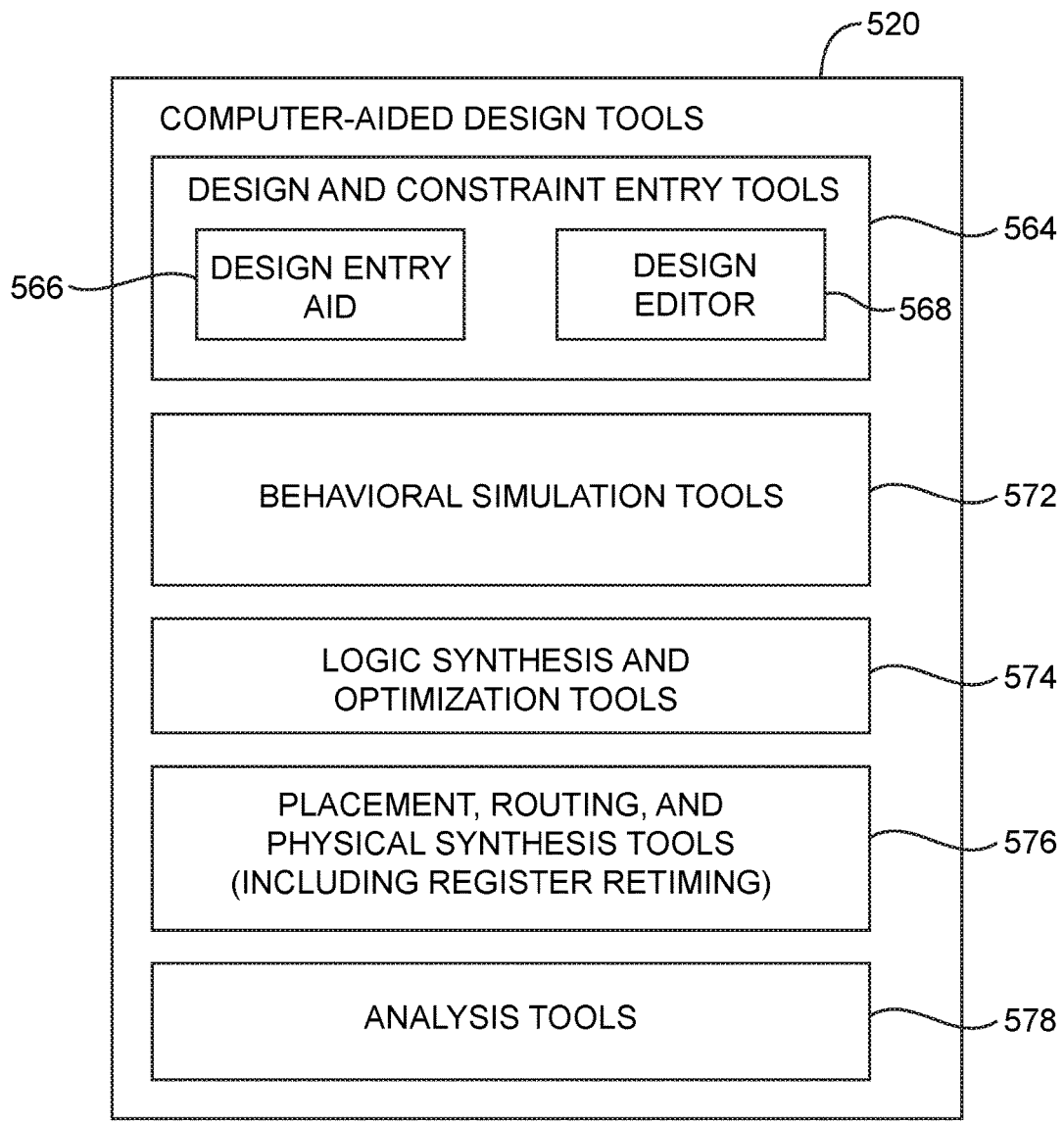
FIG. 5 is a diagram of illustrative computer-aided design (CAD) tools that may be used in a circuit design system in accordance with an embodiment.

Illustrative computer aided design tools 520 that may be used in a circuit design system such as circuit design system 400 of FIG. 4 are shown in FIG. 5.

The design process may start with the formulation of functional specifications of the integrated circuit design (e.g., a functional or behavioral description of the integrated circuit design). A circuit designer may specify the functional operation of a desired circuit design using design and constraint entry tools 564. Design and constraint entry tools 564 may include tools such as design and constraint entry aid 566 and design editor 568. Design and constraint entry aids such as aid 566 may be used to help a circuit designer locate a desired design from a library of existing circuit designs and may provide computer-aided assistance to the circuit designer for entering (specifying) the desired circuit design.

As an example, design and constraint entry aid 566 may be used to present screens of options for a user. The user may click on on-screen options to select whether the circuit being designed should have certain features. Design editor 568 may be used to enter a design (e.g., by entering lines of hardware description language code), may be used to edit a design obtained from a library (e.g., using a design and constraint entry aid), or may assist a user in selecting and editing appropriate prepackaged code/designs.

Design and constraint entry tools 564 may be used to allow a circuit designer to provide a desired circuit design using any suitable format. For example, design and constraint entry tools 564 may include tools that allow the circuit designer to enter a circuit design using truth tables. Truth tables may be specified using text files or timing diagrams and may be imported from a library. Truth table circuit design and constraint entry may be used for a portion of a large circuit or for an entire circuit.

As another example, design and constraint entry tools 564 may include a schematic capture tool. A schematic capture tool may allow the circuit designer to visually construct integrated circuit designs from constituent parts such as logic gates and groups of logic gates. Libraries of preexisting integrated circuit designs may be used to allow a desired portion of a design to be imported with the schematic capture tools.

If desired, design and constraint entry tools 564 may allow the circuit designer to provide a circuit design to the circuit design system 400 using a hardware description language such as Verilog hardware description language (Verilog HDL), Very High Speed Integrated Circuit Hardware Description Language (VHDL), SystemVerilog, or a higher-level circuit description language such as OpenCL or SystemC, just to name a few. The designer of the integrated circuit design can enter the circuit design by writing hardware description language code with editor 568. Blocks of code may be imported from user-maintained or commercial libraries if desired.

After the design has been entered using design and constraint entry tools 564, behavioral simulation tools 572 may be used to simulate the functional performance of the circuit design. If the functional performance of the design is incomplete or incorrect, the circuit designer can make changes to the circuit design using design and constraint entry tools 564. The functional operation of the new circuit design may be verified using behavioral simulation tools 572 before synthesis operations have been performed using tools 574. Simulation tools such as behavioral simulation tools 572 may also be used at other stages in the design flow if desired (e.g., after logic synthesis). The output of the behavioral simulation tools 572 may be provided to the circuit designer in any suitable format (e.g., truth tables, timing diagrams, etc.).

Once the functional operation of the circuit design has been determined to be satisfactory, logic synthesis and optimization tools 574 may generate a gate-level netlist of the circuit design, for example using gates from a particular library pertaining to a targeted process supported by a foundry, which has been selected to produce the integrated circuit. Alternatively, logic synthesis and optimization tools 574 may generate a gate-level netlist of the circuit design using gates of a targeted programmable logic device (i.e., in the logic and interconnect resources of a particular programmable logic device product or product family).

Logic synthesis and optimization tools 574 may optimize the design by making appropriate selections of hardware to implement different logic functions in the circuit design based on the circuit design data and constraint data entered by the logic designer using tools 564. As an example, logic synthesis and optimization tools 574 may perform multi-level logic optimization and technology mapping based on the length of a combinational path between registers in the circuit design and corresponding timing constraints that were entered by the logic designer using tools 564.

After logic synthesis and optimization using tools 574, the circuit design system may use tools such as placement, routing, and physical synthesis tools 576 to perform physical design steps (layout synthesis operations). Tools 576 can be used to determine where to place each gate of the gate-level netlist produced by tools 574. For example, if two counters interact with each other, tools 576 may locate these counters in adjacent regions to reduce interconnect delays or to satisfy timing requirements specifying the maximum permitted interconnect delay. Tools 576 create orderly and efficient implementations of circuit designs for any targeted integrated circuit (e.g., for a given programmable integrated circuit such as a field-programmable gate array (FPGA)).

Tools such as tools 574 and 576 may be part of a compiler suite (e.g., part of a suite of compiler tools provided by a programmable logic device vendor). In certain embodiments, tools such as tools 574, 576, and 578 may also include timing analysis tools such as timing estimators. This allows tools 574 and 576 to satisfy performance requirements (e.g., timing requirements) before actually producing the integrated circuit.

As an example, tools 574 and 576 may perform register retiming by moving registers through combinational logic (e.g., through logic AND, OR, XOR, and other suitable gates, look-up tables (LUTs), multiplexers, arithmetic operators, etc.). Tools 574 and 576 may push registers forward or backward across combinational logic as illustrated in FIG. 2. If desired, tools 574 and 576 may perform forward and backward pushes of registers by configuring pipelined routing resources such as pipelined routing resource 300 of FIG. 3 to operate in non-pipeline mode or as a pipelined routing element. Physical synthesis tools 576 used in this way can therefore also be used to perform register retiming. However, performing retiming operations on pipelined routing elements (e.g., pipelined routing resources) is merely illustrative. If desired, physical synthesis tools 576 may perform retiming operations on any suitable register.

After an implementation of the desired circuit design has been generated using tools 576, the implementation of the design may be analyzed and tested using analysis tools 578. For example, analysis tools 578 may include timing analysis tools, power analysis tools, or formal verification tools, just to name a few.

After satisfactory optimization operations have been completed using tools 520 and depending on the targeted integrated circuit technology, tools 520 may produce a mask-level layout description of the integrated circuit or configuration data for programming the programmable logic device.

Figure 6:
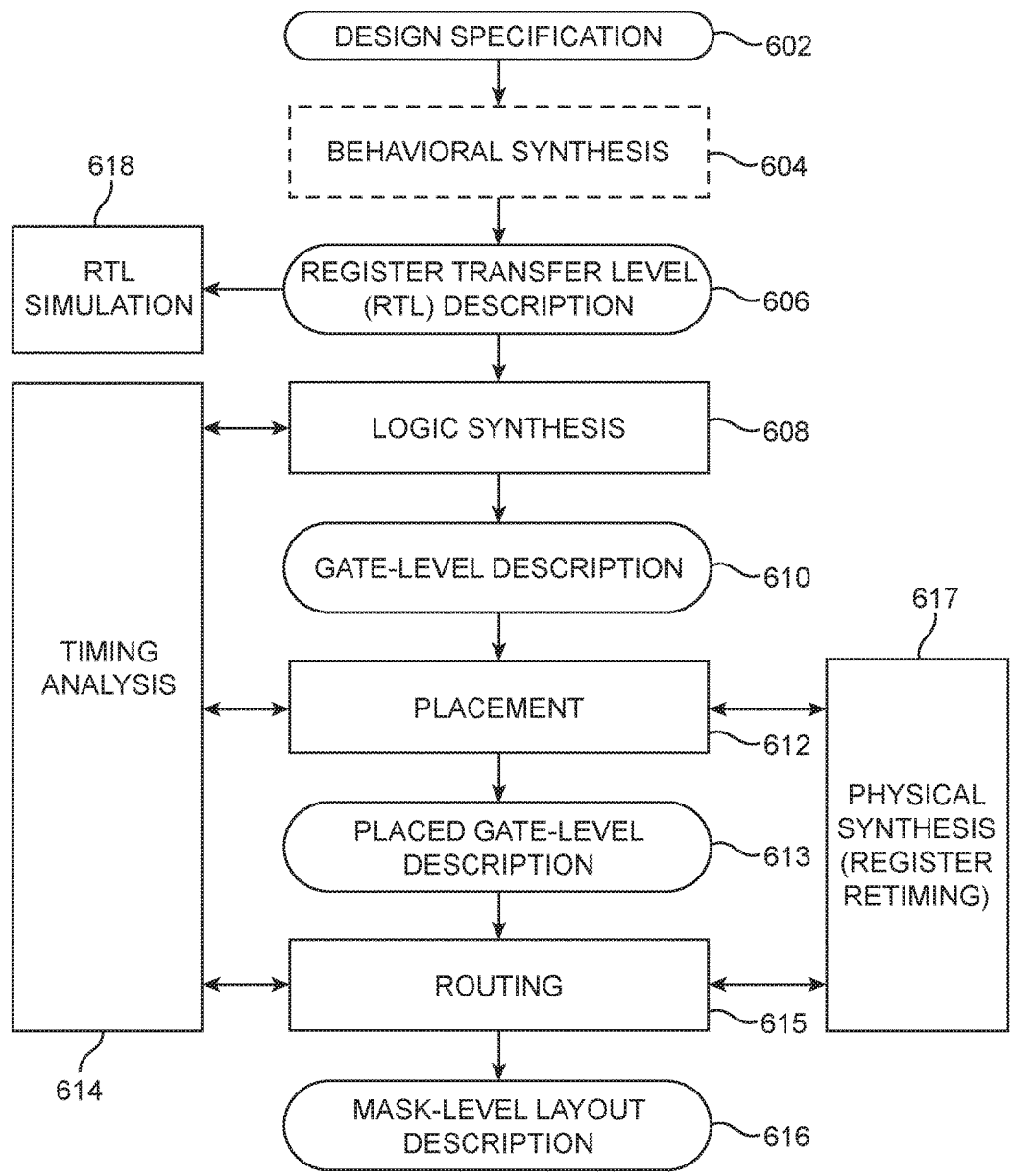
FIG. 6 is a flow chart of illustrative steps for designing an integrated circuit in accordance with an embodiment.

Illustrative operations involved in using tools 520 of FIG. 5 to produce the mask-level layout description of the integrated circuit are shown in FIG. 6. As shown in FIG. 6, a circuit designer may first provide a design specification 602. The design specification 602 may, in general, be a behavioral description provided in the form of an application code (e.g., C code, C++ code, SystemC code, OpenCL code, etc.). In some scenarios, the design specification may be provided in the form of a register transfer level (RTL) description 606.

The RTL description may have any form of describing circuit functions at the register transfer level. For example, the RTL description may be provided using a hardware description language such as the Verilog hardware description language (Verilog HDL or Verilog), the SystemVerilog hardware description language (SystemVerilog HDL or SystemVerilog), or the Very High Speed Integrated Circuit Hardware Description Language (VHDL). If desired, a portion or all of the RTL description may be provided as a schematic representation.

In general, the behavioral design specification 602 may include untimed or partially timed functional code (i.e., the application code does not describe cycle-by-cycle hardware behavior), whereas the RTL description 606 may include a fully timed design description that details the cycle-by-cycle behavior of the circuit at the register transfer level.

Design specification 602 or RTL description 606 may also include target criteria such as area use, power consumption, delay minimization, clock frequency optimization, or any combination thereof. The optimization constraints and target criteria may be collectively referred to as constraints.

Those constraints can be provided for individual data paths, portions of individual data paths, portions of a design, or for the entire design. For example, the constraints may be provided with the design specification 602, the RTL description 606 (e.g., as a pragma or as an assertion), in a constraint file, or through user input (e.g., using the design and constraint entry tools 564 of FIG. 5), to name a few.

At step 604, behavioral synthesis (sometimes also referred to as algorithmic synthesis) may be performed to convert the behavioral description into an RTL description 606. Step 604 may be skipped if the design specification is already provided in form of an RTL description.

At step 618, behavioral simulation tools 572 may perform an RTL simulation of the RTL description, which may verify the functionality of the RTL description. If the functionality of the RTL description is incomplete or incorrect, the circuit designer can make changes to the HDL code (as an example). During RTL simulation 618, actual results obtained from simulating the behavior of the RTL description may be compared with expected results.

During step 608, logic synthesis operations may generate gate-level description 610 using logic synthesis and optimization tools 574 from FIG. 5. If desired, logic synthesis operations may perform register retiming as illustrated in FIG. 2 according to the constraints that are included in design specification 602 or RTL description 606. The output of logic synthesis 608 is gate-level description 610.

During step 612, placement operations using for example placement tools 576 of FIG. 5 may place the different gates in gate-level description 610 in a preferred location on the targeted integrated circuit to meet given target criteria (e.g., minimize area and maximize routing efficiency or minimize path delay and maximize clock frequency or any combination thereof). The output of placement 612 is placed gate-level description 613, that satisfies the legal placement constraints of the underlying target device.

During step 615, routing operations using for example routing tools 576 of FIG. 5 may connect the gates from the placed gate-level description 613. Routing operations may attempt to meet given target criteria (e.g., minimize congestion, minimize path delay and maximize clock frequency or any combination thereof). The output of routing 615 is a mask-level layout description 616 (sometimes referred to as routed gate-level description 616).

While placement and routing is being performed at steps 612 and 615, physical synthesis operations 617 may be concurrently performed to further modify and optimize the circuit design (e.g., using physical synthesis tools 576 of FIG. 5). If desired, register retiming operations may be performed during physical synthesis step 617. For example, registers in the placed gate-level description 613 or the routed gate-level description 616 may be moved around according to the constraints that are included in design specification 602 or RTL description 606.

As an example, register retiming operations may change the configuration of some pipelined routing resources (e.g., some instances of pipelined routing resource 300 of FIG. 3) from operating in pipeline register mode to operating in non-pipelined mode and the configuration of other pipelined routing resources (e.g., other instances of pipelined routing resources 300 of FIG. 3) from operating in non-pipelined mode to operating in pipeline register mode. To avoid obscuring the embodiments, the change of states for pipeline routing resources may be referred to simply as a move (e.g., movement) of pipeline registers (e.g., pipelined routing resources that operate in pipeline register mode). However, performing register retiming operations on pipelined routing resources is merely illustrative. As previously mentioned, retiming operations may be performed on any suitable type routing resource (e.g., any suitable type of register, registers in a LAB or MLAB, etc.).

For example, in a first scenario, changing the configuration of a given pipelined routing resource from operating in pipeline register mode to operating in non-pipelined mode may be referred to removing a pipeline register. For example, in a second scenario, changing the configuration of another given pipelined routing resource from operating in non-pipelined mode to operating in pipeline register mode may be referred to as adding a pipeline register. When the first and second scenarios correspond to each other (e.g., occur simultaneously, a pipeline register may be referred to as being moved from the location of the removed pipeline register to the location of the added pipeline register.

In accordance with an embodiment of the present invention, pipeline registers (e.g., register 306 in FIG. 3) within an integrated circuit (e.g., PLD 100) may collectively have a number of possible states (e.g., during power-up, during reset, during normal operation, etc.). For example, a possible state may be a state in which all of the pipeline registers within an integrated circuit all have values of "0" (e.g., store a value of "0"). Another possible state may be a state in which all of the pipeline registers within an integrated circuit all have values of "1" (e.g., store a value of "1". In yet another example, a first group of pipeline registers may store values of "0" and a second group of pipeline registers may store values of "1". This is merely illustrative. If desired, any set of states may be stored at the pipeline registers within an integrated circuit at any given time.

Furthermore, the use and modification of pipeline registers as described in FIG. 6 (and any other relevant figures) are merely illustrative. If desired, any suitable type of register may be used and modified (e.g., during retiming operations).

Figure 7:
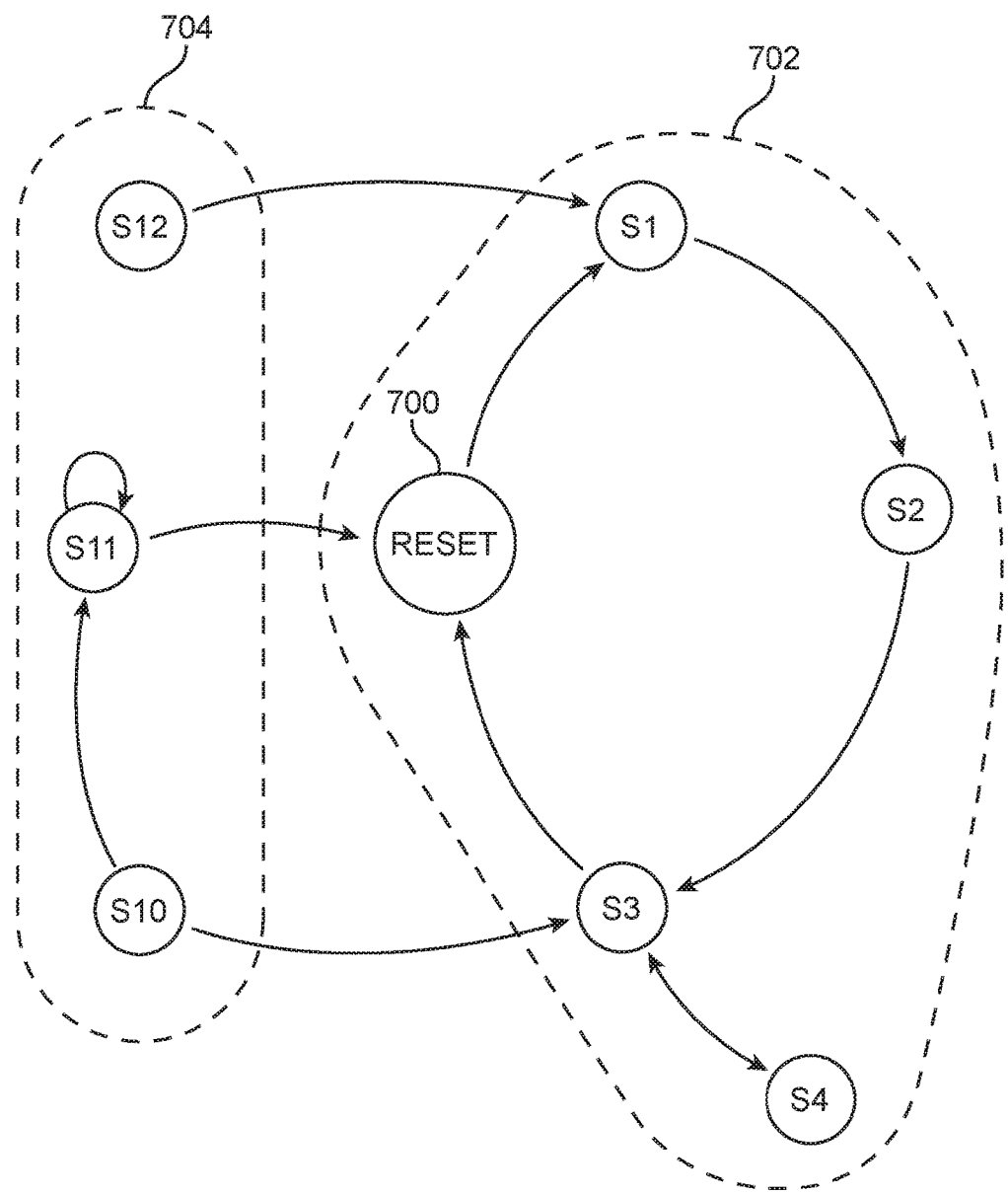
FIG. 7 is a diagram of an illustrative graph of possible states that registers may transition between in accordance with an embodiment.

FIG. 7 shows a diagram of a number of possible states associated with exemplary data latching registers within an integrated circuit (e.g., PLD 100). The registers of FIG. 7 may be normal user registers or pipeline registers that are used to help improve the performance of device 100.

In particular, possible states associated with the registers (e.g., a set of pipeline registers 306 within PLD 100, a set of any registers within PLD 100, a set of any registers within a logic circuit, etc.) may include states S1, S2, S3, S4, S10, S11, S12, and Reset.

Arrows that point from a first given state to a second given state may indicate possible transitions from the first given state to the second given state. The possible transitions may occur when the registers are clocked using one or more clock signals (e.g., after a clock cycle of a clock signal, at a rising edge of a clock signal, at a falling edge of a clock signal, at both the rising and falling edges of a clock signal, etc.) to help the registers latch an incoming state value. In other words, during a single state transition, the primary inputs may have a new set of values and the registers may be clocked for a single clock cycle to provide a new set of values to the registers to hold. As an example, a first rising clock edge may cause the registers to transition from state S12 to state S1. As another example, a second rising clock edge may be a self-cycling transition, such as when state S11 makes no transition (e.g., state S11 is maintained).

The arrows may have directionality. For example, transition from state S12 to state S1 may occur as indicated by the direction of the allow linking the two states. In contrast, state S1 to state S12 may be an impossible transition since the arrow does not point in that direction. Furthermore, state S12 to state S11 may also be an impossible transition because there is no direct path linking the two. However, this is merely illustrative. If desired, the states and transitions between the states may be in accordance with a given set of registers that may have any suitable behavior. For example, states S3 and S4 may transition between one another.

Power-up circuitry or start-up circuitry (e.g., initialization circuitry) within integrated circuit 100 may power up registers, and thus providing the registers with an unknown state. To operate the integrated circuit, it may be desirable to reset registers to a known state upon device startup. The known initialized state may be referred to as a reset state (e.g., reset state 700). To reach reset state 700, one or more clock signals may be clocked to provide a reset sequence (e.g., a particular set of transitions between the possible states) to the registers. Initialization circuitry may be used to provide the reset sequence to the registers, if desired. The reset sequence may be a set of transitions that guarantees that no matter which state the registers powered up to, the reset state 700 may be reached using the reset sequence. For example, a reset sequence may transition to state S3 for some initial states before making the final transition to reset state 700. As another example, the reset sequence may cause the registers to transition from state S11 to reset state 700. This is merely illustrative. If desired, any reset sequence may be used to bring the registers (e.g., pipeline registers) to reset state 700.

After reaching reset state 700, the registers may operate in a first set of states referred to as legal states such as legal states 702. In other words, after resetting the registers, only the legal states may be accessible by the registers. The states that may not be accessed after reset operations are referred to as illegal states such as illegal states 704. For example, after reaching reset state 700, all further transitions from reset state 700 may cycle between states S1, S2, S3, S4, and Reset, collectively legal states 702. In other words, there may be no transition from legal states 702 to any states in illegal states 704 (e.g., states S10, S11, and S12).

The diagram of FIG. 7 may apply to registers in a given configuration. When the given configuration changes, the diagram of FIG. 7 may change accordingly. For example, tools 576 of FIG. 5 may perform retiming operations that change the configuration of the registers (e.g., move registers across portions of combinational logic). The number of registers itself may be different in the retimed circuit, which implies that the number of states may also be different in the retimed circuit. Thus, the original reset sequence may not be able to account for the configuration changes and properly reset the registers in the changed configuration to the reset state.

Figure 8A:
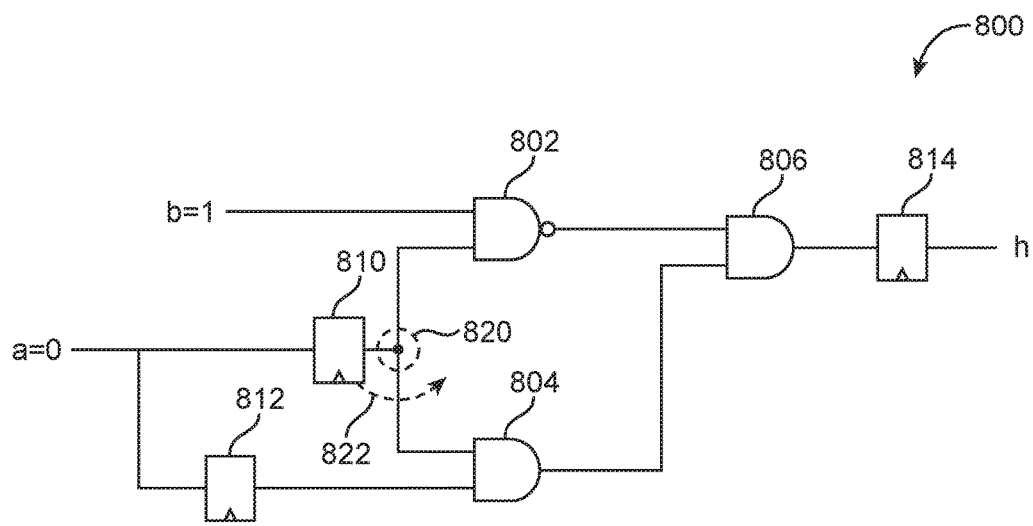
FIG. 8A is a diagram of an illustrative circuit prior to retiming in accordance with an embodiment.

In particular, FIG. 8A shows an illustrative circuit such as circuit 800 within integrated circuit 100 that may be retimed to operate more efficiently as described in FIG. 2. Circuit 800 may include logic NAND gate 802, logic AND gates 804 and 806, and registers 810, 812, and 814. One or more of registers 810, 812, and 814 may be pipeline registers.

Logic NAND gate 802 may have a first input that is coupled to input b. Logic NAND gate 802 may have a second input that is coupled to an output of register 810. An input terminal (e.g., data input terminal) of register 810 may be coupled to input a. AND gate 804 may have two input terminals. A first input terminal of AND gate 804 may be coupled to the output terminal of register 810. A second input terminal of AND gate 804 may be coupled to an output of register 812. An input terminal (e.g., data input terminal) of register 812 may be coupled to input a. AND gate 806 may have two input terminals. A first input terminal of AND gate 806 may be coupled to an output terminal of NAND gate 802. A second input terminal of AND gate 806 may be coupled to an output terminal of AND gate 804. Register 814 may receive an output of AND gate 806 and provide an output h. Registers 810, 812, and 814 may be clocked using a given clock signal (e.g., registers 810, 812, and 814 may be part of the same clock domain). This is merely illustrative. If desired, any suitable clocking configuration may be used.

The power-up process for circuit 800 may be performed using initialization circuitry (not shown) within integrated circuit 100. The initialization circuitry may also perform resetting operations using reset sequences. As described in connection with FIG. 7, after power-up and prior to reset, registers may hold an unknown state. For example, register 810 may hold value "0", register 812 may hold value "0", and register 814 may hold value "1". Alternatively, registers 810, 812, and 814 may power up to any other state. Registers 810, 812, and 814 may be reset using a reset sequence to provide a known reset state values to registers 810, 812, and 814. For example, circuit 800 may have a reset state of register 810 holding value "0", register 812 holding value "0", and register 814 holding value "0". The associated reset sequence to bring circuit 800 to the reset state includes a single transition clocked for a single clock cycle using a clock signal. In particular, during the single clock cycle, NAND gate 802 may receive value "1" from input b, while registers 810 and 812 may receive value "0" from input a.

After the single clock cycle, registers 810 and 812 are provided with known values of "0". Register 814 may also be at a known state of "0" because regardless of previous values stored in registers 810 and 812, register 814 will be holding a value of "0" after the single clock cycle. For example, as previously described, if registers 810 and 812 both hold values of "0" prior to the single clock cycle, AND gate 806 will receive a value of "1" at its first input terminal and a value of "0" at its second input terminal, and will provide a value of "0" to register 814 during the single clock cycle. Other scenarios are omitted as to not unnecessarily obscure the present embodiment.

In an embodiment, tool 576 may perform retiming on circuit 800 of FIG. 8A to move register 810 across node 820 (e.g., fan-out node 820) as indicated by dashed arrow 822. Subsequent to retiming operations, circuit 800 of FIG. 8A may be transformed into retimed circuit 800' of FIG. 8B.

As a result of retiming, register 810 may be removed from the retimed circuit 800' and replaced by registers 810-1 and 810-2. The second input terminal of NAND gate 802 may be coupled to an output terminal of register 810-1. A data input terminal of register 810-1 may receive values from input a. The first input terminal of AND gate 804 may be coupled to an output terminal of register 810-2. A data input terminal of register 810-2 may receive values from input a.

As previously described in connection with resetting register 814, register 814 may be at known value of "0" regardless of the previous values stored in registers 810 and 812 after the single clock cycle. In other words, the value stored at register 814 may be deterministic after the single clock cycle. However, in retimed circuit 800' the value stored at register 814 may not be deterministic after the single clock cycle. For example, after power-up and prior to reset operations, registers 810-1, 810-2, and 812 may have logic values of "0", "1", and "1", respectively. Therefore, after the single clock cycle reset as described in FIG. 8A, AND gate 806 may receive a logic value of "1" at its first input and also a logic value of "1" at its second input. As a consequence, register 814 may hold a logic value of "1" after the single cycle and retimed circuit 800' may not be in a reset state. Since with at least one possible power-up state of retimed circuit 800', retimed circuit 800' cannot reach the reset state using the single clock cycle reset sequence, it would be desirable to provide a new reset sequence that can properly help retimed circuit 800' reach the intended reset state.

An issue arises with the single clock cycle reset sequence when registers 810-1 and 810-2 may not hold/store the same value (e.g., when one holds a logic "0" and the other holds a logic "1"). If registers 810-1 and 810-2 were to store the same value, then the value stored at register 814 may be deterministic as in circuit 800. In order to provide registers 810-1 and 810-2 with the same value, an adjustment sequence may be appended (more specifically, prepended) to the single clock cycle reset sequence. In other words, the single clock cycle reset sequence may be delayed by a number of clock cycles of the adjustment sequence.

The adjustment sequence may have a given length (e.g., an adjustment length or a length based on an adjustment value) that specifies a number of transitions between states. In other words, the given length may determine a number of clock cycles that may be clocked by retimed circuitry (e.g., retimed circuit 800') to provide logic values to the registers to help reset the registers. For example, the given length may be calculated based on types of circuitry within integrated circuit 100. The calculation process may be determined by characterizing different circuits within integrated circuit 100 by their types, as detailed in subsequent embodiments.

To properly reset retimed circuit 800', the given length may be calculated to be equal to one. During the number of clock cycles (e.g., while implementing the adjustment sequence), random values (e.g., logic values of "0" and/or "1") may be provided to the registers (e.g., registers 810-1, 810-2, and 812) by applying random values to the primary inputs. Because the input terminals of registers 810-1 and 810-2 are both coupled to fan-out node 820, which is coupled to input a, during the adjustment sequence lasting one clock cycle, when a random logic value of "1" or "0" is provided at input a, registers 810-1 and 810-2 may be provided with the same random value. As such, after implementing the adjustment sequence using the initialization circuitry, the single clock cycle reset sequence may be used to properly reset retimed circuit 800'.

The adjustment sequence may substantially depend on the number of clock cycles and not primary data inputs (e.g., data provided to registers). In other words, the registers are allowed to receive random primary input values during the entirety of the adjustment sequence. Thus, the adjustment sequence may be referred to as having a number of "empty" clock cycles.

The reset sequence prepended by the adjustment sequence may be referred to as an adjusted reset sequence or retimed reset sequence. The example of the adjustment sequence having a length of one is merely illustrative. If desired, the adjustment sequence may have any suitable length. The adjustment sequence may also provide values that are non-random, if desired.

In accordance with an embodiment, circuits such as circuit 800 shown in FIG. 8A may be referred to herein as an "original" circuit (e.g., a circuit before retiming or generally a circuit before any registers moves for optimization, such as register merging, register duplication, etc.). The reset sequence associated with the original circuit may be referred to herein as an "original" reset sequence. Circuits that have been modified such as circuit 800' shown in FIG. 8A may be referred to herein as a retimed circuit (e.g., a circuit after retiming). The reset sequence associated with the retimed circuit may be referred to herein as a "retimed" reset sequence, referring generally to account for various types of register moves, as an "adjusted" reset sequence.

In particular, circuits (e.g., circuit 800') may be referred to herein as c-cycle delayed versions of original circuits (e.g., circuit 800) because an adjustment sequence of c clock cycles may be used to delay an original reset sequence to generate an adjusted reset sequence. For example, circuit 800' may be a 1-cycle delayed version of circuit 800 because an adjustment sequence of one clock cycle may be used to delay the original reset sequence to generate the adjusted reset sequence.

Further details of generating c-cycle delayed reset sequences are provided in U.S. patent application Ser. No. 15/342,286, entitled "METHODS FOR DELAYING REGISTER RESET FOR RETIMED CIRCUITS," which is hereby incorporated by reference in its entirety. Additionally, further details of generating c-cycle delayed reset sequences that have a user-specified maximum c value or adjustment value are provided in U.S. patent application Ser. No. 15/352,487, entitled "METHODS FOR BOUNDING THE NUMBER OF DELAYED RESET CLOCK CYCLES FOR RETIMED CIRCUITS," which is also hereby incorporated by reference in its entirety. Moreover, further details relating to verification of the generated c-cycle delayed reset sequences are provided in U.S. patent application Ser. No. 15/354,809, entitled "METHODS FOR VERIFYING RETIMED CIRCUITS WITH DELAYED INITILIZATION," which is hereby incorporated by reference in its entirety.

Figure 8B:
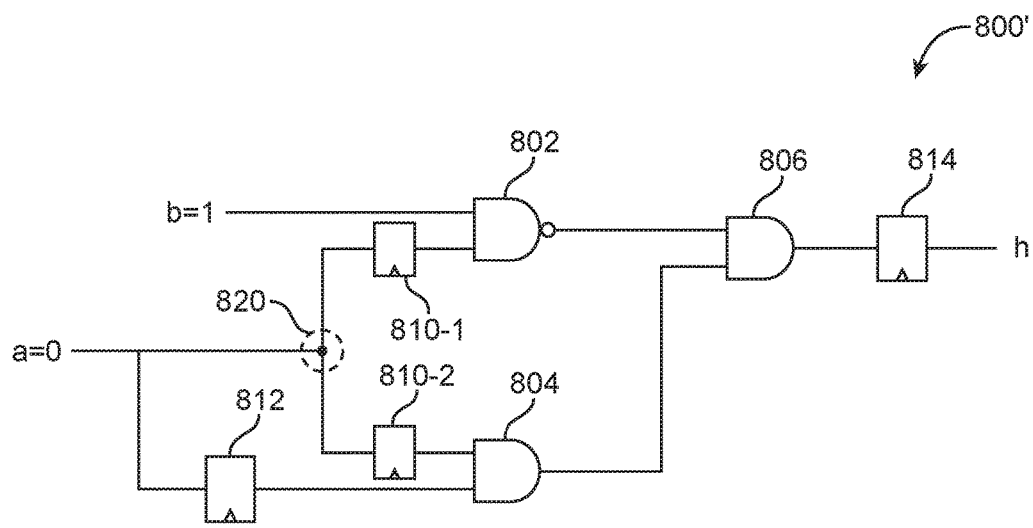
FIG. 8B is a diagram of a retimed version of the circuit of FIG. 8A in accordance with an embodiment.
Figure 9:
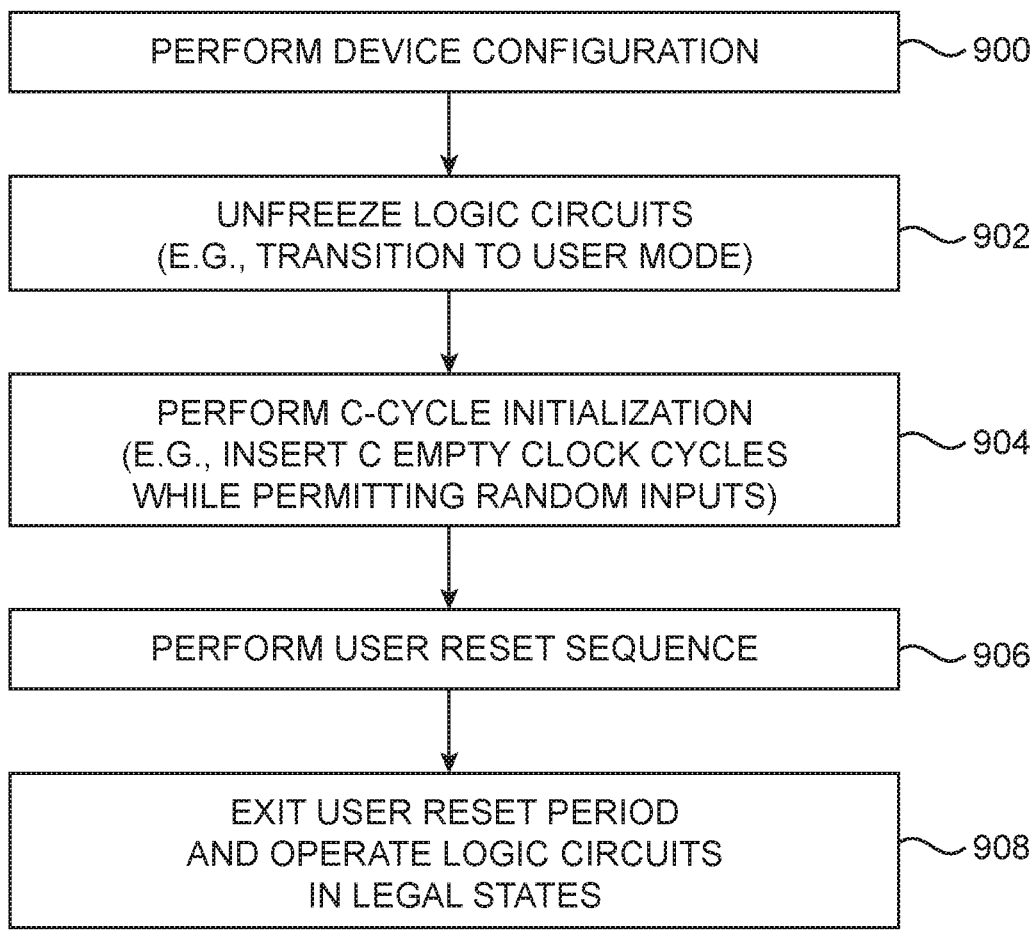
FIG. 9 is a flow chart of illustrative steps for resetting retimed circuitry in accordance with an embodiment.

FIG. 9 shows a flow chart of illustrative steps for resetting retimed circuitry (e.g., retimed circuit 800' in FIG. 8B).

At step 900, a configuration device may perform device configuration for a target device (e.g., a programmable integrated circuit). As an example, a logic design system (e.g., CAD tools 420 in FIG. 4) may provide configuration data to configuration data loading equipment, which then provides configuration data to the target device using a configuration device (e.g., a configuration system, configuration circuitry, etc.), thereby performing device configuration. If desired, the configuration device may be part of the target device or separate from the target device.

At step 902, an initialization module (e.g., an auto-initialization module) may unfreeze logic circuits within the target device. In other words, by unfreezing the logic circuits, the initialization module may transition the target device to user mode. For example, the initialization module may be within the target device (e.g., the programmable integrated circuit).

At step 904, the initialization module may perform c-cycle initialization on (i.e., provide the adjustment sequence to) the configured target device as described in FIGS. 8A and 8B. To perform c-cycle initialization, the initialization module may first receive a length of the adjustment sequence (e.g., a number of "empty" clock cycles) guaranteed to properly reset the retimed circuitry on the configured target device (for example, from the configuration device). The determination of the adjustment sequence and the implementation of c-cycle initialization may be hidden from the user, as an example.

If desired, the reset sequence and in particular, the adjustment sequence, may be determined without any user input (e.g., without user-placed limitations). Alternatively, the user may provide a maximum reset sequence length to CAD tools 420 to generate an adjustment sequence that adheres to the maximum reset sequence length constraint. Furthermore, after CAD tools 420 generates an adjustment sequence and a corresponding adjusted reset sequence, verification circuitry may verify that the adjustment sequence and the corresponding adjusted reset sequence properly resets the retimed circuitry.

At step 906, the user may provide the retimed logic design configured on the target device with the user-defined reset sequence. In other words, reset initialization circuitry may provide a user-specified reset sequence to the configured target device. After prepending the user-defined reset sequence with the adjustment sequence, the retimed circuitry within the configured target device may be properly reset. The user may perform the user-defined reset only after performing c-cycle initialization in step 904, for example.

At step 906, after the user has provided the configured target device with the adjusted reset sequence that includes the adjustment sequence and the user-specified reset sequence, reset initialization circuitry may exit user reset period and operate logic circuits on the configured target device in legal states, which are described in FIG. 7. In other words, the reset initialization circuitry may provide signals that indicate the configured integrated circuit is properly reset and may begin normal operations.

Figure 10:
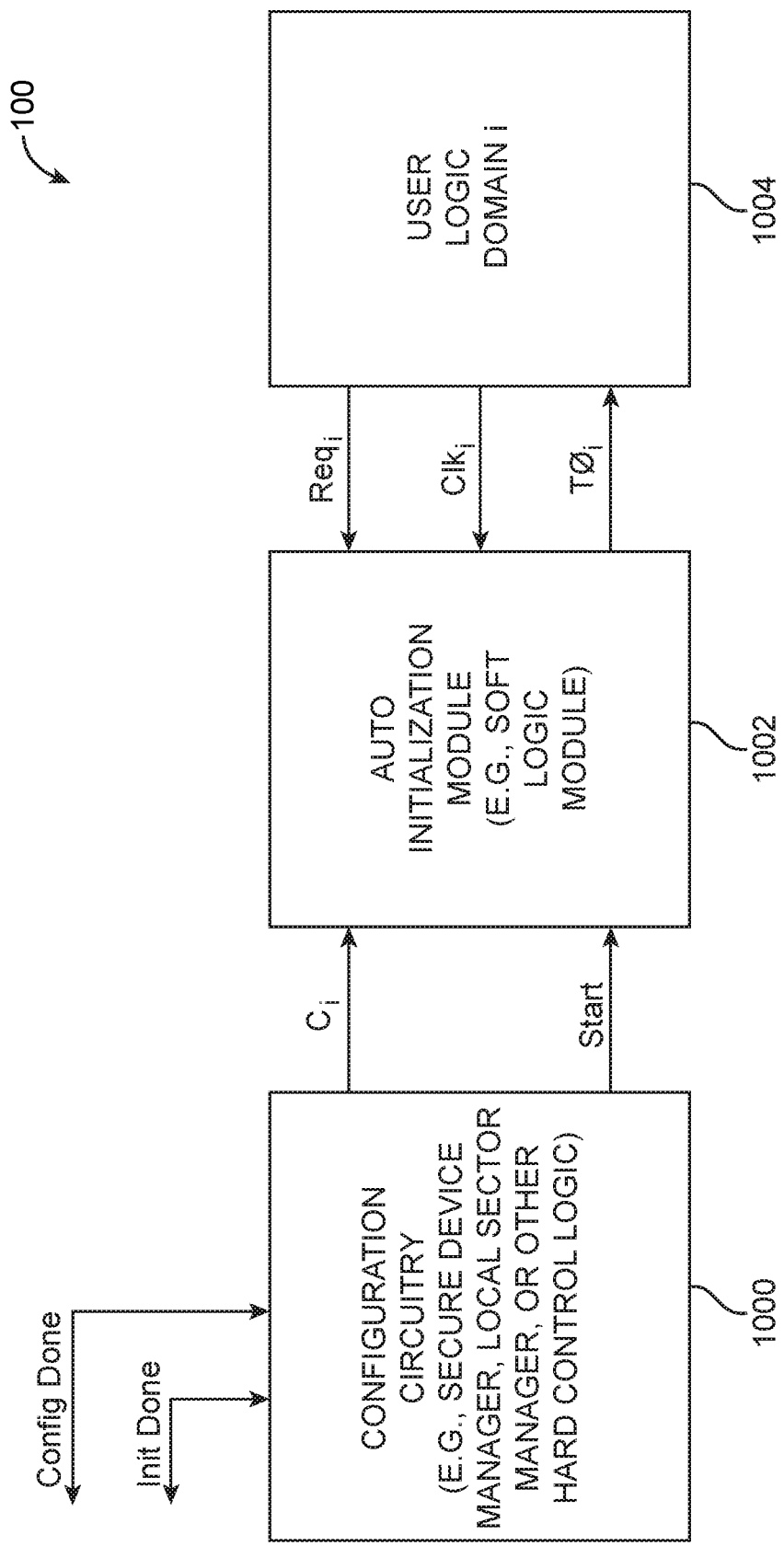
FIG. 10 is a diagram of illustrative reset initialization circuitry in accordance with an embodiment.

FIG. 10 shows illustrative reset initialization circuitry within PLD 100. The reset initialization circuitry may include configuration circuitry 1000, auto initialization module 1002, and user logic 1004. The reset initialization circuitry may be formed entirely from soft logic or hard-wired logic, as examples. If desired, a portion of the reset initialization circuitry may be formed form soft logic and a different portion of the reset initialization circuitry may be formed from hardwired logic.

In particular, configuration circuitry 1000 may be a secure device manager (SDM), a local sector manager, or any other type of hard control logic. Alternatively, configuration circuitry 1000 may also be formed from soft logic (e.g., formed from configurable logic). Configuration circuitry 1000 may generate a signal that indicates when configuration of a target integrated circuit is complete (e.g., signal Config-Done). Alternatively, configuration circuitry 1000 may receive signal ConfigDone, if another portion of PLD 100 monitors the configuration process of PLD 100 (e.g., step 900 in FIG. 9). Similarly, configuration circuitry 1000 may generate or receive a signal (e.g., signal InitDone) that indicates when the unfreezing of logic circuits within PLD 100 may be completed, as described in step 902 in FIG. 9.

By noting when configuration and unfreezing of PLD 100 is completed (e.g., when respective signals ConfigDone and InitDone are asserted), configuration circuitry 1000 may indicate when soft auto initialization module 1002 may begin performing c-cycle initialization by providing signal Start to auto initialization module 1002. Additionally, configuration circuitry 1000 may also receive from CAD tools 420 in FIG. 4 or generate internally, an adjustment sequence length, or a number of "empty" clock cycles. Adjustment sequence length $c_i$ may be provided to auto initialization circuitry in parallel with signal Start, for example.

Auto initialization module 1002 may be sometimes referred to herein as soft logic module 1002. Whereas configuration circuitry 1000 may be formed using hard logic that includes a dedicated function, soft logic module 1002 may be programmed to perform the functions of an auto initialization module. For example, during configuration and initialization (e.g., unfreezing) of PLD 100, auto initialization module 1002 may be automatically implemented using programmable hardware within PLD 100. As an example, initialization module 1002 may be implemented on PLD 100 only when a user indicated (using a user input or an input signal) that it may be desirable to perform c-cycle initialization. As another example, auto initialization module 1002 may be automatically implemented on PLD 100 may when design tools 420 calculate a count value c greater than zero (indicating a possible improper reset).

User Logic 1004 may communicate with auto initialization module 1002. In particular, user logic 1004 may provide signal $Req_i$ to auto initialization module 1002 to selectively perform a functional reset of registers within PLD 100. The functional reset may be different from the initial reset after the initial configuration and unfreezing of PLD 100. The functional reset may be triggered by issues that arise during the operation of PLD 100, for example, or other suitable trigger events.

Output signal $T0_i$ (sometimes referred to herein as reset control signal $T0_i$) may be provided from auto initialization module 1002 to user logic 1004 as a corresponding signal to signal $Req_i$ sent from user logic 1004 to auto-initialization module 1002. In particular, signal $T0_i$ may indicate when a user-specified reset sequence may begin. In other words, when signal $T0_i$ is asserted, registers within PLD 100 have completed clocking of the prepending adjustment sequence and are ready to receive the original reset sequence (e.g., user-specified reset sequence). In addition, signal $T0_i$ may be asserted in response to signal $Req_i$. In particular, when signal $Req_i$ is asserted, signal $T0_i$ may also be asserted. For example, only after signal $Req_i$ is deasserted, can signal $T0_i$ be deasserted.

As previously described in connection with generating c-cycle delayed reset sequences and adjustment sequences, adjusted reset sequences and adjustment sequences may be provided on a per-clock basis. In other words, registers that receives a first clock signal may be separately processed (e.g., perform c-cycle initialization separately, reset separately) from register that receive a second, different clock signal. However, if desired, the two types of registers may be processed or reset in parallel. As shown in FIG. 10, user logic may be for domain i, where i is for a particular clock domain. User logic 1005 for domain i (e.g., user logic 1005 of domain i), may provide signal $Clk_i$, which is the clock signal for domain i, to auto initialization module 1002. Additionally, signals $C_i$, $Req_i$, and $T0_i$ may also be generated a domain i basis.

As an example, design tools 420 may optimize a circuit design to be implemented on PLD 100 (e.g., by performing retiming operations, or by performing any other operations that may affect reset of the circuit design implemented on PLD 100, etc.). If through the optimization process (e.g., retiming process) performed by design tools 420, count value c for any clock domain is greater than zero, which indicates a possible improper reset of the relevant circuitry, a corresponding c-cycle delayed reset sequence for each clock domain may be automatically implemented. In other words, if register retiming requires an adjustment sequence, the adjustment sequence is automatically inserted (i.e., auto-insertion) to properly perform reset operations.

Figure 11:
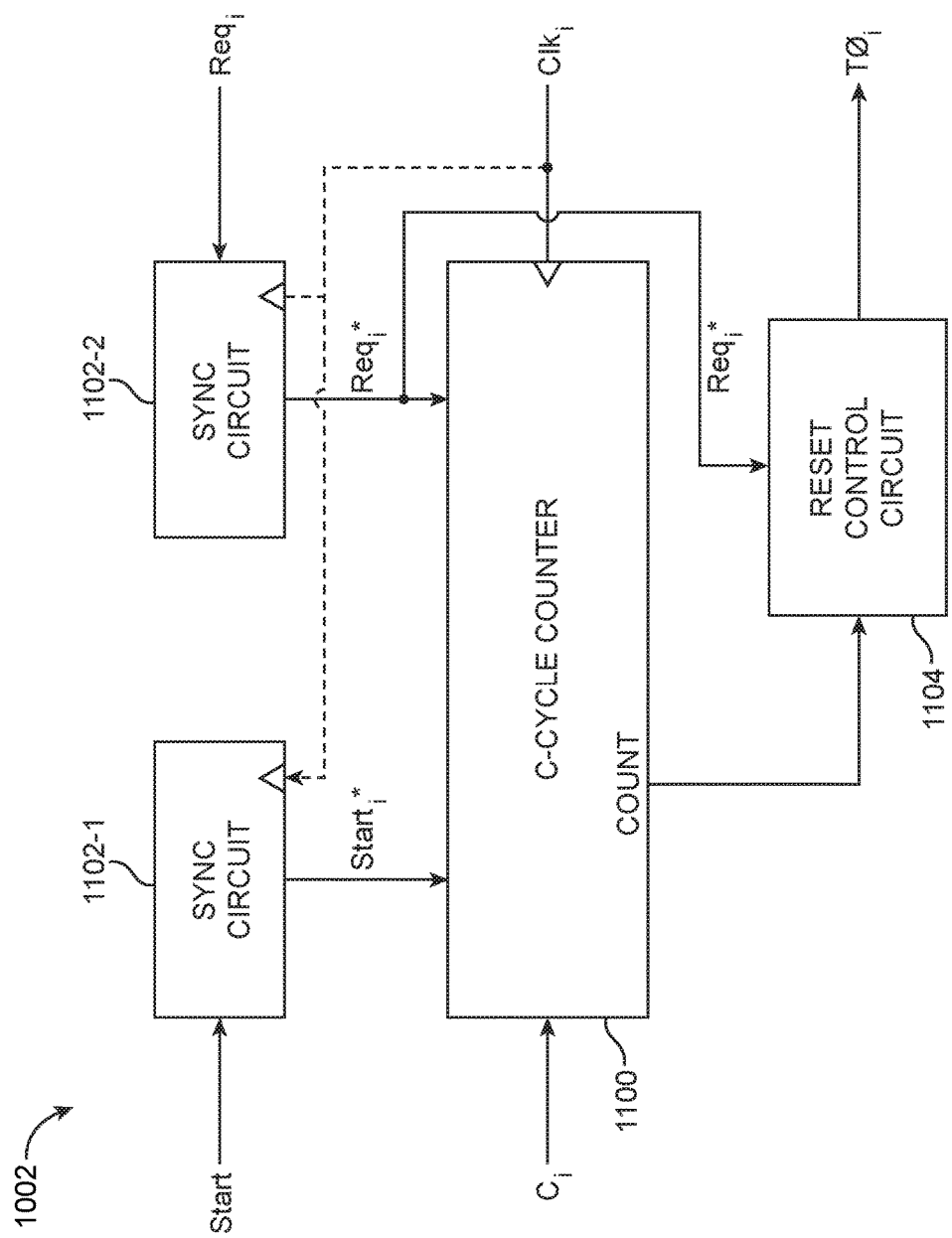
FIG. 11 is a diagram of an illustrative auto initialization module within the reset initialization circuitry of FIG. 10 in accordance with an embodiment.

FIG. 11 shows an illustrative auto initialization module implemented within PLD 100. Auto initialization module 1002 may include c-cycle counter 1100. C-cycle counter 1100 may be receive adjustment sequence length $c_i$ (sometimes referred to herein as c-cycle length $c_i$). C-cycle counter 1100 may count downward from c-cycle length $c_i$ according to clock signal $Clk_i$ received from user logic 1004. As previously described c-cycle length $c_i$ may correspond to the same domain i as clock signal $Clk_i$.

In a first mode of operation, synchronization circuit 1102-1 may receive signal Start (sometimes referred to herein as trigger signal Start or reset trigger signal Start) from configuration circuitry 1000. Synchronization circuit 1102-2 may synchronize reset trigger signal Start to clock signal $Clk_i$ such that c-cycle counter 1100 may correctly count adjustment sequence length $c_i$ (e.g., provide a correct number of "empty" clock cycles of clock signal $Clk_i$). After analyzing clock signal $Clk_i$ for a number of clock cycles, synchronization circuit 1102-1 may provide synchronized reset trigger signal $start_i$*, which indicates that c-cycle counter 1100 may begin counting operations. In other words, synchronized reset trigger signal $start_i$* may enable c-cycle counter 1100 to begin counting operations.

At any given time, signal COUNT may provide a current count value of c-cycle counter 1100 to reset control circuit 1104. In particular, reset control circuit 1104 may provide reset control signal $T0_i$ to user logic domain. In a scenario, when signal $Req_i$* is deasserted and signal COUNT provides a non-zero current count value, a deasserted output signal $T0_i$ then may be provided to user logic 1004, indicating that the adjustment sequences is incomplete. Reset control signal $T0_i$ may be asserted when a current count value of zero is provided to reset control circuit 1104. Reset control circuit 1104 may perform a handshaking protocol with synchronized signal $Req_i$* for robust communication, which is described in detail below.

Auto initialization module may further include synchronization circuit 1102-2, which may receive reset request signal $Req_i$ from user logic 1004. Analogous to synchronization circuit 1102-1, synchronization circuit 1102-2 may synchronize user reset signal $Req_i$ to clock signal $Clk_i$. Synchronization circuit 1102-2 may generate corresponding synchronized user reset signal $Req_i$*. C-cycle counter 1100 and reset control circuit 1104 may receive synchronized signal $Req_i$*.

In a second mode of operation, a user reset request (e.g., using reset trigger signal $Req_i$, sometimes referred to herein as trigger signal $Req_i$ or user reset request signal $Req_i$) may be provided to auto initialization module 1002. In other words, an asserted reset trigger signal $Req_i$ may be provided to auto initialization module 1002. The corresponding synchronized reset trigger signal $Req_i$* may prompt c-cycle counter 1100 may begin an adjustment sequence. In other words, c-cycle counter 1100 may perform (downward) counting operations analogous to the operation in the first mode of operation. Because the counting is initialized by a user request, signals $Req_i$, $Req_i$*, $T0_i$ may communicate sequentially with one another to convey when each step of the reset operation is completed. In particular, this sequential communication may be referred to herein as a "handshake"

operation or "handshaking" operation. For example, the handshaking operation may be performed with a reset trigger signal and a reset control signal.

For example, when c-cycle counter completes the adjustment sequence, which was prompted by a synchronized signal of request signal $Req_i$ from user logic 1004, reset control signal $T0_i$ may be subsequently communicate with user logic 1004 by asserting signal $T0_i$. An asserted signal $T0_i$ may indicate to user logic 1004 that the adjustment sequence has been completed and a user-specified reset sequence may begin. After user logic 1004 receives confirmation in the form of an asserted signal $T0_i$ from auto initialization module 1002 that the adjustment sequence has completed, user logic 1004 may deassert request signal $Req_i$. The deassertion of request signal $Req_i$ may be conveyed using synchronized signal $Req_i^*$ to auto initialization module 1002 (for example, reset control circuit 1104, in particular) that user logic 1004 has acknowledged the completion of the adjustment sequence.

Figure 12:
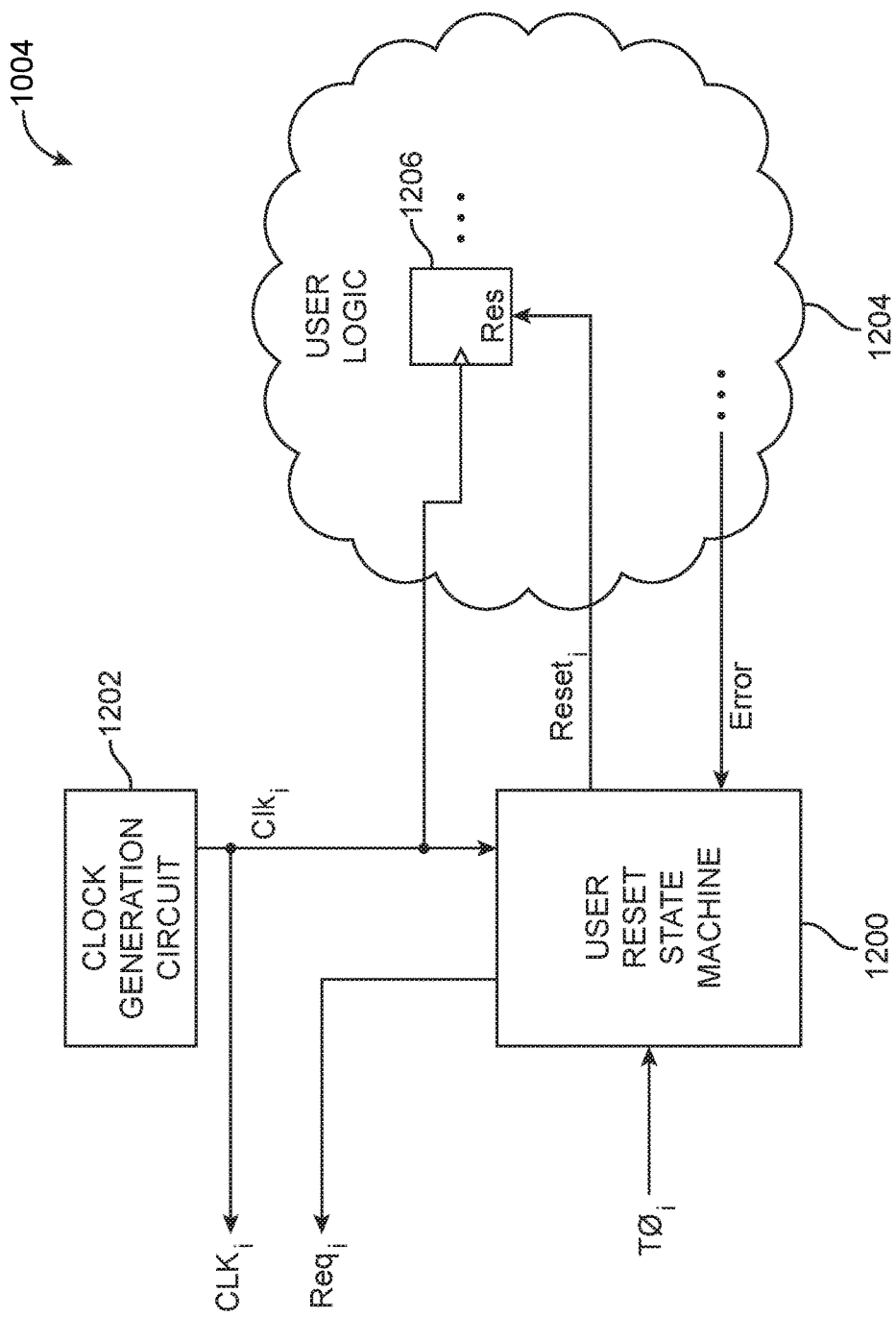
FIG. 12 is a diagram of illustrative user logic circuitry within the reset initialization circuitry of FIG. 10 in accordance with an embodiment.

FIG. 12 shows illustrative user logic circuitry within the reset initialization circuitry in FIG. 10. User logic circuitry 1004 may include user reset state machine 1200 and clock generation circuit 1202. Clock generation circuit 1202 may generate clock signal $Clk_i$. In other words, clock generation circuit 1202 may generate one or more clock signals of different clock domains. Clock generation circuit 1202 may provide generated clock signal $Clk_i$ to auto initialization module 1002 for synchronization operation, to user logic circuits as a clocking signal, to user reset state machine 1200 for any suitable use, etc. User reset state machine 1200 may generate user reset requests and implement reset sequences (e.g., an adjustment sequence, an original reset sequence, etc.).

User logic 1004 for domain i may include user logic circuits 1204 (e.g., a signification portion of user logic 1004 that may be implemented on PLD 100 as a logic design). For example, user logic circuits 1204 may include retimed circuitry, registers, or any other desired circuitry. In particular, user logic circuits may include register 1206 and other registers in the same clock domain as shown by the ellipses. User logic circuits 1204 may also include registers of other clock domains. Register 1206 may receive clock signal $Clk_i$ (e.g., register 1206 and additional registers within user logic circuits 1204 may be clocked using clock signal $Clk_i$). Additionally, register 1206 may include a primary input or input Res. Input Res may be referred to herein as a reset input because during the adjustment sequence the actual inputs to register 1206 is irrelevant. Properly resetting register 1206, for example may only rely on a number of clock cycles clocked by register 1206 during the adjustment sequence. Input Res may receive signal $Reset_i$ from user reset state machine 1200. Signal $Reset_i$ may convey either random value in the adjustment sequence or selected values during the user-specified reset sequence.

As an example, reset state machine 1200 may receive error signal Error from user logic circuits 1204. Error generation circuitry may generate the signal Error after determining that there may be an error within user logic circuits 1204. An error may be, for example, the existence of an illegal state during normal operations of user logic circuits 1204. There may be a dedicated error generation circuitry. However, if desired multiple portions of user logic circuits 1204 may generate corresponding error signals to be received at user reset state machine 1200.

In response to receiving, an asserted signal Error, user reset state machine 1200 may correspondingly assert reset request signal $Req_i$. The asserted reset request signal $Req_i$ may prompt auto initialization module to resolve the error by performing a reset operation.

Signal $T0_i$ may be asserted when reset control circuit 1104 within auto initialization module 1002 has determined that the adjustment sequence been implemented (or c-cycle initialization has been completed). As an example, when signal $T0_i$ is asserted, user reset state machine 1200 may initiate any user-specified reset sequence to user logic circuits 1204. User reset state machine 1200 may also deassert $Req_i$ to perform the handshake operation as described in FIG. 11.

Figure 13:
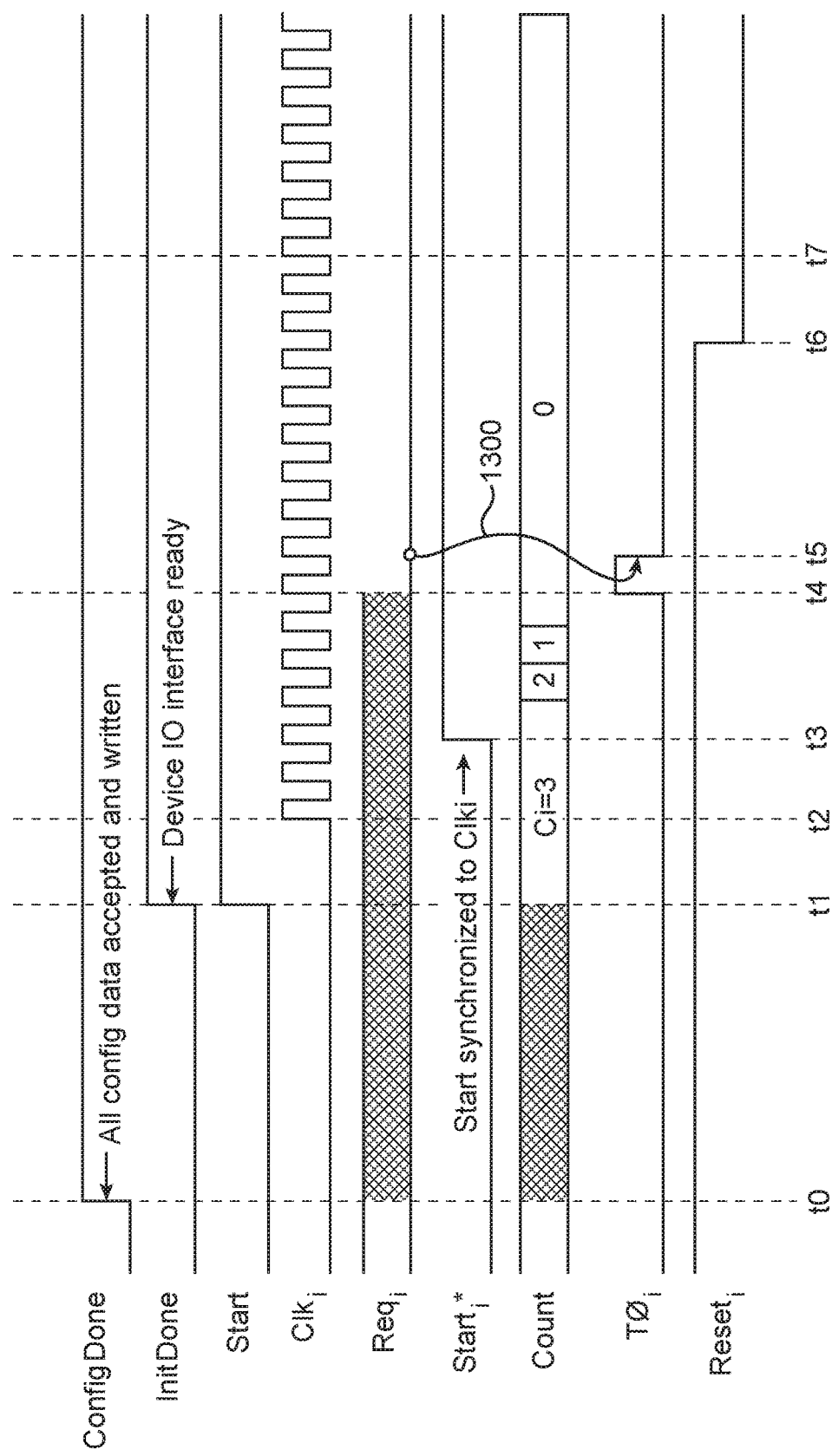
FIG. 13 is an illustrative timing diagram of operating the reset initialization circuitry of FIG. 10 after initial configuration of retimed circuitry in accordance with an embodiment.

FIG. 13 is a timing diagram showing an illustrative mode of operation for reset initialization circuitry in FIG. 10. In particular, the mode of operation shown in FIG. 13 may be implemented after initial configuration of PLD 100, for example. At time t0, signal ConfigDone may be asserted to indicate that configuration of a programmable logic device based on a logic design provided by a user is completed. As such, the time period prior to time t0 may be referred to herein as a configuration period. Signal ConfigDone may be generated by configuration circuitry 1000 in FIG. 10 or may be received by configuration circuitry 1000 from monitor circuitry within PLD 100.

At time t1, signal InitDone may be asserted to indicate that the PLD input-output interface is ready to interact with a user. In other words, signal InitDone may indicated that PLD 100 has entered user mode (e.g., PLD 100 has been unfrozen). As such, the time period between time t0 and time t1 may be referred to herein as an unfreeze period or a transition to user mode period. Once a target device has entered user mode, reset operations may begin prepare the target device for normal operation within legal states. To explicitly trigger reset operations, trigger signal Start and count value signal Count may be also asserted at time t1. As an example, the assertions of signals Start and Count may be triggered by the assertion of signal InitDone and may follow the assertion of signal InitDone.

At time t2, clock signal $Clk_i$ may be provided from user logic 1004 to auto initialization module 1002, as described in FIG. 10. Signal Count may begin at a value equal to c-cycle length $c_i$, as described in FIGS. 10 and 11. However, signal Count may only begin decrementing when a clock-synchronized start signal $Start_i^*$ is asserted at time t3. Between time t2 and t3, synchronization circuitry 1102-1 may generate signal $Start_i^*$ by synchronizing signal Start according to clock signal $Clk_i$.

At time t3, signal Count may begin decrementing to begin c-cycle initialization. For example, a c-cycle length may be four, thus signal Count may begin at a value of four. After a four-cycle adjustment sequence (at time t4), signal Count may have a value of zero. The time period between time t1 and t4 may be referred to herein as a c-cycle initialization period, which includes both the entire synchronization process and the actual counting operations.

At time t4, signal $T0_i$ may be asserted to indicated the completion of c-cycle initialization. As an example, user request signal $Req_i$ may be automatically asserted throughout the configuration, unfreezing, and c-cycle initialization operations. As an example, user request signal $Req_i$ may be deasserted once c-cycle initialization has been completed. Because $Req_i$ is deasserted at the end of c-cycle initialization, indicating a lack of user-initiated reset request, signal $T0_i$ may be deasserted a single clock cycle after time t4, at time t5. In other words, a handshake operation may occur as indicated by arrow 1300, during which signal $T0_i$ is responsively deasserted according to the deassertion of request signal $Req_i$.

After the c-cycle initialization period, a user reset period may begin at time t4 and end at time t7. During which period a user reset sequence may append the adjustment sequence implemented during the c-cycle initialization period. In particular, the user reset sequence may begin at time t5, when signal $T0_i$ is deasserted in response to a lack of any user reset requests. The user reset sequence may end at time t6, as shown by signal $Reset_i$. In other words, signal $Reset_i$ may provide an adjustment sequence from time t3 to t4 and a user reset sequence from time t5 to t6 to user logic 1004. Signal $Reset_i$ may be provided within user logic 1004 (e.g., from user reset state machine 1200 to circuitry within user logic circuits 1204 as described in FIG. 12). Time t7 may begin normal operation of the user logic. For example, between time t6 and t7 any other reset sequence or operations may be performed to bring user logic 1004 out of reset beginning at time t7.

Figure 14:
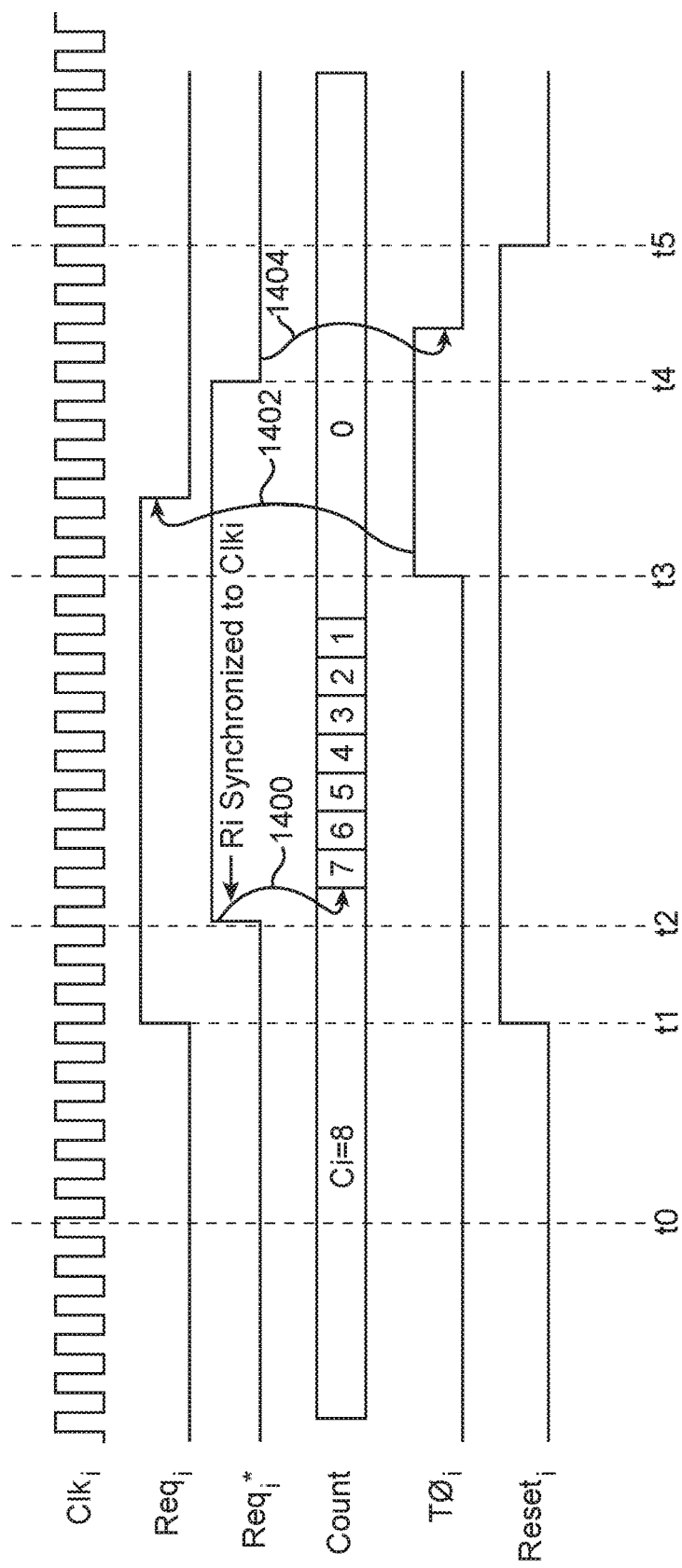
FIG. 14 is an illustrative timing diagram of operating the reset initialization circuitry of FIG. 10 after a user reset request in accordance with an embodiment.

FIG. 14 is a timing diagram showing an additional illustrative mode of operation for reset initialization circuitry in FIG. 10. In particular, the mode of operation shown in FIG. 14 may be implemented following a user request for reset of PLD 100, which may occur during normal operation of user logic implemented on PLD 100, for example.

At time to, an event may occur within the user logic that prompts (e.g., triggers) reset of the user logic. At time t1, in response to the event, trigger signal $Req_i$ may be asserted to provide a reset request from the user logic 1004 to auto initialization module 1002. At time t2, trigger signal $Req_i$ may be synchronized to clock signal $Clk_i$ to assert synchronized trigger signal $Req_i^*$.

At time t2, signal Count may count downward during a c-cycle initialization period, similar to the mode of operation described in FIG. 13. As an example, a count value of eight (indicating an adjustment sequence of eight cycles) may be preserved within configuration circuitry 1000, even during normal operation of user logic 1004. However, only when a synchronized request signal is asserted may signal Count begin decrementing. In other words, as indicated by arrow 1400, the assertion of synchronized request signal $Req_i^*$ prompts decrementing c-cycle counter 1100 in FIG. 11 and signal Count.

At time t3, signal $T0_i$ may be asserted in response to the completion of the c-cycle initialization period between time t2 and t3. As indicated by arrow 1402, signal $T0_i$ may await the deassertion of user reset request signal before deasserting $T0_i$. As an example, the deassertion of user reset request signal $Req_i$ is synchronized to clock signal $Clk_i$ to deassert synchronized request signal $Req_i^*$ at time t4. As indicated by arrow 1404, this event triggers the subsequent deassertion of signal $T0_i$.

As described previously in connection with FIG. 11, the combination of arrows 1400, 1402, and 1404 creates a robust communication system between user logic 1004 and auto initialization module 1002. In other words, user logic 1004 and auto initialization module 1002 perform handshaking operations to guarantee that the information is properly conveyed (e.g., request with a given user reset is serviced). For example, auto initialization module 1002 may keep reset control signal $T0_i$ asserted as long as request signal $Req_i$ (or corresponding signal $Req_i^*$) is asserted.

Similar to the user reset period of FIG. 13, during the c-cycle initialization period and the user reset period between time t1 and t5, signal $Reset_i$ may be similarly asserted to perform any adjustment sequence and user-specified reset sequence. If desired, signal $Reset_i$ may be asserted at time t2 instead of time t1 to align with the synchronized reset signal $Req_i^*$. At time t5, user logic 1004 may again perform normal operations.

These steps are merely illustrative. The existing steps may be modified or omitted; some of the steps may be performed in parallel; additional steps may be added; and the order of certain steps may be reversed or altered.

The embodiments thus far have been described with respect to integrated circuits. The methods and apparatuses described herein may be incorporated into any suitable circuit. For example, they may be incorporated into numerous types of devices such as programmable logic devices, application specific standard products (ASSPs), and application specific integrated circuits (ASICs). Examples of programmable logic devices include programmable arrays logic (PALs), programmable logic arrays (PLAs), field programmable logic arrays (FPGAs), electrically programmable logic devices (EPLDs), electrically erasable programmable logic devices (EEPLDs), logic cell arrays (LCAs), complex programmable logic devices (CPLDs), and field programmable gate arrays (FPGAs), just to name a few.

The programmable logic device described in one or more embodiments herein may be part of a data processing system that includes one or more of the following components: a processor; memory; IO circuitry; and peripheral devices. The data processing can be used in a wide variety of applications, such as computer networking, data networking, instrumentation, video processing, digital signal processing, or any suitable other application where the advantage of using programmable or re-programmable logic is desirable. The programmable logic device can be used to perform a variety of different logic functions. For example, the programmable logic device can be configured as a processor or controller that works in cooperation with a system processor. The programmable logic device may also be used as an arbiter for arbitrating access to a shared resource in the data processing system. In yet another example, the programmable logic device can be configured as an interface between a processor and one of the other components in the system. In one embodiment, the programmable logic device may be one of the family of devices owned by ALTERA/INTEL Corporation.

The foregoing is merely illustrative of the principles of this invention and various modifications can be made by those skilled in the art. The foregoing embodiments may be implemented individually or in any combination.

What is claimed is:

1. An integrated circuit, comprising:
    logic circuitry that is resettable using a reset sequence;
    configuration circuitry configured to program the logic circuitry to implement a custom logic function, wherein the configuration circuitry is configured to provide a count value; and
    an initialization module interposed between the logic circuitry and the configuration circuitry, wherein the initialization module is configured to delay the reset sequence by a number of clock cycles equal to the count value.

2. The integrated circuit of claim 1, wherein the initialization module is configured to receive a clock signal from the logic circuitry.

3. The integrated circuit of claim 2, wherein the initialization module is configured to receive a reset trigger signal from a selected one of the configuration circuitry and the logic circuitry.

4. The integrated circuit of claim 3, wherein the reset trigger signal comprises a start signal that is conveyed from the configuration circuitry to the initialization module.

5. The integrated circuit of claim 3, wherein the reset trigger signal comprises a request signal that is conveyed from the logic circuitry to the initialization module.

6. The integrated circuit of claim 3, wherein the initialization module comprises a synchronization circuit for synchronizing the reset trigger signal with the clock signal to produce a synchronized reset trigger signal.

7. The integrated circuit of claim 6, wherein the initialization module further comprises a counter circuit that is enabled by the synchronized reset trigger signal.

8. The integrated circuit of claim 7, wherein the initialization module further comprises a reset control circuit that monitors when the counter circuit has counted the number of clock cycles equal to the count value.

9. The integrated circuit of claim 8, wherein the reset control circuit is configured to receive the reset trigger signal and to perform a handshaking protocol with the reset trigger signal.

10. The integrated circuit of claim 9, wherein the reset control circuit is configured to assert an output signal when the counter has counted the number of clock cycles equal to the count value and to deassert the output signal in response to deassertion of the reset trigger signal, and wherein the output signal is conveyed to the logic circuitry.

11. A method of operating an integrated circuit that includes logic circuitry, configuration circuitry, and an initialization circuit, the method comprising:
with the configuration circuitry, programming the logic circuitry to implement a custom logic function;
with the configuration circuitry, providing a count value;
with the initialization circuit, delaying a reset sequence by a number of clock cycles equal to the count value if the count value is greater than zero, wherein the initialization circuit is coupled between the logic circuitry and the configuration circuitry; and
after delaying the reset sequence by the number of clock cycles, resetting the logic circuitry using the reset sequence.

12. The method of claim 11, further comprising:
with the configuration circuitry, asserting a configuration done signal indicative of when the programming of the logic circuitry is complete; and
with the configuration circuitry, asserting an initialization done signal after an unfreezing period following the asserting of the configuration done signal.

13. The method of claim 11, further comprising:
with a counter circuit in the initialization circuit, generating a counter output; and
with a reset control circuit in the initialization circuit, receiving the counter output from the counter circuit and a request signal from the logic circuitry.

14. The method of claim 13, further comprising:
in response to determining that the counter output is equal to zero, using the reset control circuit to assert a reset control signal; and
in response to determining that the request signal is deasserted, deasserting the reset control signal.

15. The method of claim 13, further comprising:
with the logic circuitry, asserting the request signal;
in response to determining that the counter output is equal to zero, using the reset control circuit to assert a reset control signal while the request signal is asserted; and
keeping the reset control signal asserted as long as the request signal is asserted.

16. An integrated circuit, comprising:
logic circuitry configured to output a request signal and a clock signal;
configuration circuitry configured to output a counter value and a start signal; and
an initialization module configured to receive the request signal and the clock signal from the logic circuitry, wherein the initialization module is configured to receive the counter value and the start signal from the configuration circuitry and wherein the initialization module is configured to delay a reset sequence for the logic circuitry based on the counter value.

17. The integrated circuit of claim 16, wherein the initialization module comprises:
a counter circuit configured to store the counter value for an initialization of the counter circuit, wherein the counter circuit is selectively enabled by at least one of the start signal and the request signal and is controlled by the clock signal.

18. The integrated circuit of claim 17, wherein the initialization module further comprises:
a reset control circuit configured to monitor when the counter circuit exhibits a count value of zero, wherein the reset control circuit is configured to receive the request signal and to output a control signal.

19. The integrated circuit of claim 18, wherein the logic circuitry comprises:
a reset state machine configured to receive the control signal from the reset control circuit, to output the request signal, and to output a reset signal.

20. The integrated circuit of claim 19, wherein the logic circuitry further comprises:
a register that is resettable by the reset signal, wherein the reset state machine is configured to receive an error signal that triggers an assertion of the request signal.

* * * * *